United States Patent
Pietraski et al.

(10) Patent No.: US 8,788,920 B2
(45) Date of Patent: *Jul. 22, 2014

(54) DETECTION, AVOIDANCE AND/OR CORRECTION OF PROBLEMATIC PUNCTURING PATTERNS IN PARITY BIT STREAMS USED WHEN IMPLEMENTING TURBO CODES

(71) Applicant: Interdigital Technology Corporation, Wilimington, DE (US)

(72) Inventors: Philip J. Pietraski, Jericho, NY (US); Gregory S. Sternberg, Mt. Laurel, NJ (US)

(73) Assignee: InterDigital Technology Corporation, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/744,984

(22) Filed: Jan. 18, 2013

(65) Prior Publication Data

US 2013/0139040 A1   May 30, 2013

Related U.S. Application Data

(63) Continuation of application No. 13/309,962, filed on Dec. 2, 2011, now Pat. No. 8,359,520, which is a continuation of application No. 11/974,381, filed on Oct. 12, 2007, now Pat. No. 8,074,143, which is a continuation of application No. 10/725,779, filed on Dec. 2, 2003, now Pat. No. 7,293,217.

(60) Provisional application No. 60/494,404, filed on Aug. 11, 2003, provisional application No. 60/470,921, filed on May 15, 2003, provisional application No. 60/444,068, filed on Jan. 30, 2003, provisional application No. 60/434,232, filed on Dec. 16, 2002.

(51) Int. Cl.
*H03M 13/03* (2006.01)

(52) U.S. Cl.
USPC ............................ 714/790; 714/774; 714/786

(58) Field of Classification Search
USPC .................. 714/790, 774, 786, 752, 755, 800
See application file for complete search history.

(56) References Cited

U.S. PATENT DOCUMENTS

| | | | |
|---|---|---|---|
| 6,266,795 B1 | 7/2001 | Wei | |
| 6,370,669 B1 * | 4/2002 | Eroz et al. | ...................... 714/774 |

(Continued)

FOREIGN PATENT DOCUMENTS

| | | |
|---|---|---|
| KR | 20020004478 A | 1/2002 |
| WO | 00/11791 | 3/2000 |

(Continued)

OTHER PUBLICATIONS

"Universal Mobile Telecommunications System (UMTS); Multiplexing and channel coding (FDD); (3GPP TS 25.212 version 5.1.0 Release 5)," ETSI TS 125 212 V5.1.0 (Jun. 2002).

(Continued)

*Primary Examiner* — Fritz Alphonse
(74) *Attorney, Agent, or Firm* — Volpe and Koenig, P.C.

(57) ABSTRACT

Detecting, avoiding and/or correcting problematic puncturing patterns in parity bit streams used when implementing punctured Turbo codes is achieved without having to avoid desirable code rates. This enables identification/avoidance of regions of relatively poor Turbo code performance. Forward error correction comprising Turbo coding and puncturing achieves a smooth functional relationship between any measure of performance and the effective coding rate resulting from combining the lower rate code generated by the Turbo encoder with puncturing of the parity bits. In one embodiment, methods to correct/avoid degradations due to Turbo coding are implemented by puncturing interactions when two or more stages of rate matching are employed.

14 Claims, 12 Drawing Sheets

(56) References Cited

U.S. PATENT DOCUMENTS

| | | | |
|---|---|---|---|
| 6,397,367 B1 * | 5/2002 | Park et al. | 714/786 |
| 6,476,734 B2 | 11/2002 | Jeong et al. | |
| 6,601,214 B1 | 7/2003 | Hammons, Jr. | |
| 6,622,281 B1 * | 9/2003 | Yun et al. | 714/790 |
| 6,631,491 B1 | 10/2003 | Shibutani et al. | |
| 6,665,813 B1 | 12/2003 | Forsman et al. | |
| 6,665,833 B1 * | 12/2003 | Tong et al. | 714/790 |
| 6,744,744 B1 | 6/2004 | Tong et al. | |
| 6,845,482 B2 | 1/2005 | Yao et al. | |
| 7,028,230 B2 | 4/2006 | Manninen et al. | |
| 7,076,726 B1 | 7/2006 | Yun et al. | |
| 7,089,450 B2 | 8/2006 | Anderson et al. | |
| 7,295,625 B2 | 11/2007 | Doetsch et al. | |
| 2002/0027956 A1 | 3/2002 | Lee et al. | |
| 2002/0141433 A1 | 10/2002 | Kwon et al. | |
| 2003/0007476 A1 | 1/2003 | Kim et al. | |

FOREIGN PATENT DOCUMENTS

| | | |
|---|---|---|
| WO | 00/41343 | 7/2000 |
| WO | 0048353 A1 | 8/2000 |
| WO | 02/33910 | 4/2002 |
| WO | 03/069784 | 8/2003 |
| WO | 00/65446 | 6/2005 |

OTHER PUBLICATIONS

Interdigital, "Turbo-Coding and Pubcturing Interactions on HS-DSCH in R5 HSDPA", TSG-RAN Working Group 1 Meeting #32, R1-030444, (Paris, France May 19-23, 2003).

Mo et al., "Analysis of Puncturing Pattern for High Rate Turbo Codes," IEEE International, 0-7803-5538-5/99, 1999, pp. 547-550.

Nortel Networks, "Proposal for Rate Matching for Turbo Codes," pp. 1-5 (May 12, 1999).

Siemens et al., "HSDPA for the 1,28 Mcps TDD Option—A-VRC Test Methodology and Simulation Assumptions", TSG-RAN Working Group 4 (Radio) Meeting #26, R4-030223, (Madrid, Spain Feb. 17-21, 2003).

Siemens, "Turbo Coder Irregularities in HSDPA", 3GPP TSG-RAN Working Group 1 #32, Toc R1-030421, (Paris, France May 19-23, 2003).

Third Generation Partnership Project, "Technical Specification Group Radio Access Network; Multiplexing and Channel Coding (FDD) (Release 6)", 3GPP TS 25.212 V6.1.0 (Mar. 2004).

Third Generation Partnership Project, "Technical Specification Group Radio Access Network; Multiplexing and Channel Coding (TDD) (Release 6)", 3GPP TS 25.222 V6.0.0 (Dec. 2003).

Third Generation Partnership Project, "Technical Specification Group Radio Access Network; Channel Coding and Multiplexing Examples (Release 4)", 3GPP TR 25.944 V4.1.0 (Jun. 2001).

Third Generation Partnership Project, "Technical Specification Group Radio Access Network; Medium Access Control (MAC) Protocol Specification (Release 5)", 3GPP TS 25.321 V5.6.0 (Sep. 2003).

Third Generation Partnership Project, "Technical Specification Group Radio Access Network; MAC Protocol Specification (Release 5)", 3GPP TS 25.321 V5.2.0 (Sep. 2002).

Third Generation Partnership Project, "Technical Specification Group Radio Access Network; Medium Access Control (MAC) Protocol Specification (Release 4)", 3GPP TS 25.321 V4.9.0 (Sep. 2003).

Third Generation Partnership Project, "Technical Specification Group Radio Access Network; MAC Protocol Specification (Release 4)", 3GPP TS 25.321 V4.6.0 (Sep. 2002).

Third Generation Partnership Project, "Technical Specification Group Radio Access Network; Medium Access Control (MAC) Protocol Specification (Release 1999)", 3GPP TS 25.321 V3.16.0 (Sep. 2003).

Third Generation Partnership Project, "Technical Specification Group Radio Access Network; MAC Protocol Specification (Release 1999)", 3GPP TS 25.321 V3.13.0 (Sep. 2002).

Third Generation Partnership Project, "Technical Specification Group Radio Access Network; Channel Coding and Multiplexing Samples (Release 1999)", 3GPP TR 25.944 V3.5.0 (Jun. 2001).

Third Generation Partnership Project, "Technical Specification Group Radio Access Network; Multiplexing and Channel Coding (FDD) (Release 5)", 3GPP TS 25.212 V5.2.0 (Sep. 2002).

Third Generation Partnership Project, "Technical Specification Group Radio Access Network; Multiplexing and Channel Coding (FDD) (Release 5)", 3GPP TS 25.212 V5.4.0 (Mar. 2003).

Third Generation Partnership Project, "Technical Specification Group Radio Access Network; Multiplexing and Channel Coding (FDD) (Release 5)", 3GPP TS 25.212 V5.6.0 (Sep. 2003).

Third Generation Partnership Project, "Technical Specification Group Radio Access Network; Multiplexing and Channel Coding (TDD) (Release 5)", 3GPP TS 25.222 V5.7.0 (Sep. 2004).

Third Generation Partnership Project, "Technical Specification Group Radio Access Network; Multiplexing and Channel Coding (TDD) (Release 1999)", 3GPP TS 25.222 V3.8.0 (Mar. 2002).

Third Generation Partnership Project, "Technical Specification Group Radio Access Network; Multiplexing and Channel Coding (TDD) (Release 1999)", 3GPP TS 25.222 V3.10.0 (Sep. 2002).

Third Generation Partnership Project, "Technical Specification Group Radio Access Network; Multiplexing and Channel Coding (TDD) (Release 4)", 3GPP TS 25.222 V4.5.0 (Sep. 2002).

Third Generation Partnership Project, "Technical Specification Group Radio Access Network; Multiplexing and Channel Coding (TDD) (Release 4)", 3GPP TS 25.222 V4.6.0 (Dec. 2002).

Third Generation Partnership Project, "Technical Specification Group Radio Access Network; Multiplexing and Channel Coding (TDD) (Release 5)", 3GPP TS 25.222 V5.2.1 (Oct. 2002).

Third Generation Partnership Project, "Technical Specification Group Radio Access Network; Multiplexing and Channel Coding (TDD) (Release 5)", 3GPP TS 25.222 V5.4.0 (Mar. 2003).

Third Generation Partnership Project, "Technical Specification Group Radio Access Network; Multiplexing and Channel Coding (TDD) (Release 5)", 3GPP TS 25.222 V5.5.0 (Jun. 2003).

Third Generation Partnership Project, "Technical Specification Group Radio Access Network; High Speed Downlink Packet Access: Physical Layer Aspects (Release 5)," 3GPP TR 25.858 V5.0.0 (Mar. 2002).

* cited by examiner

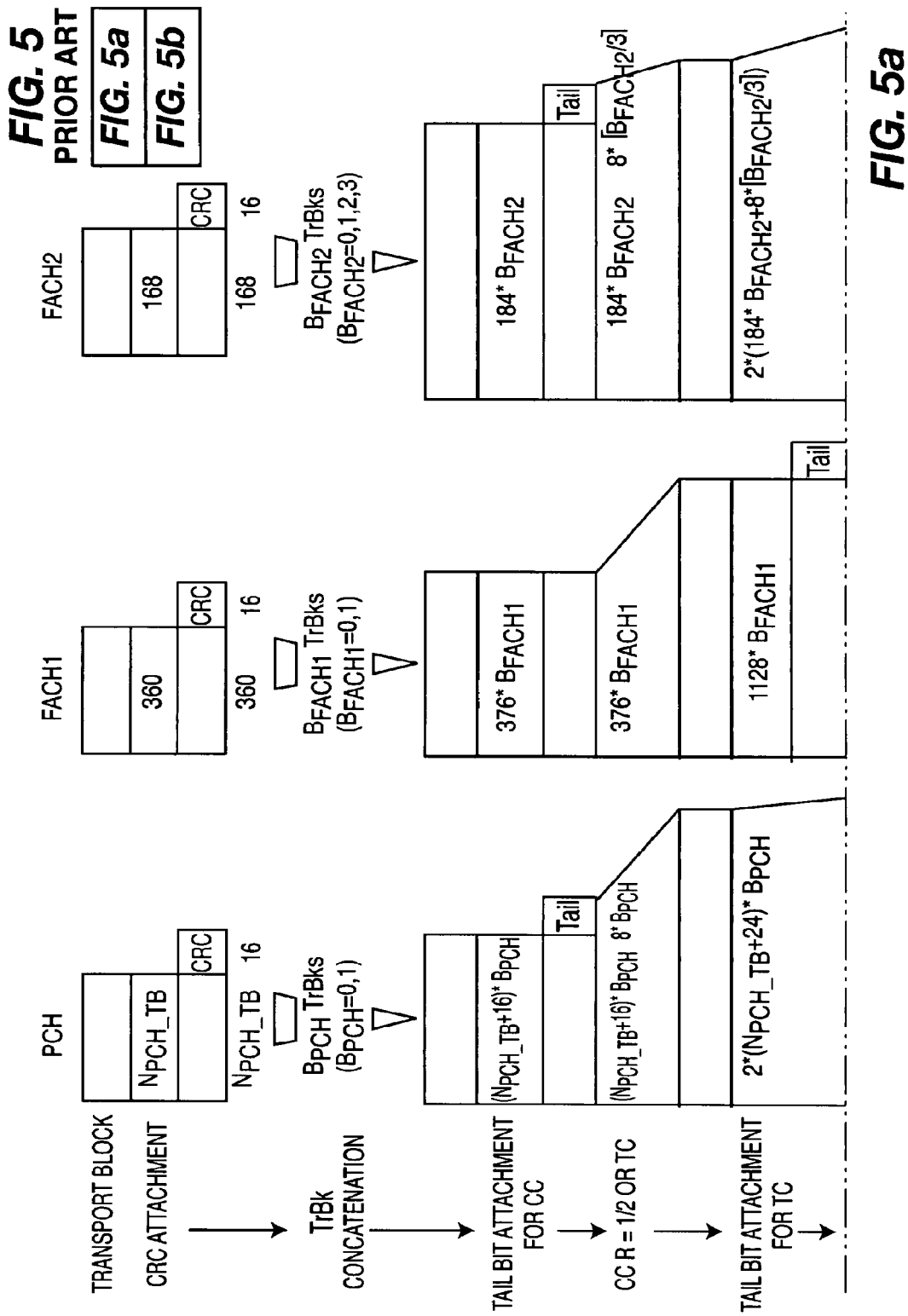

DETECTION, AVOIDANCE AND/OR CORRECTION OF PROBLEMATIC PUNCTURING PATTERNS IN PARITY BIT STREAMS USED WHEN IMPLEMENTING TURBO CODES

CROSS REFERENCE TO RELATED APPLICATIONS

This application is a continuation of U.S. patent application Ser. No. 13/309,962, filed on Dec. 2, 2011, which is a continuation of U.S. patent application Ser. No. 11/974,381 filed on Oct. 12, 2007, which issued as U.S. Pat. No. 8,074,143 on Dec. 6, 2011; which is a continuation of U.S. patent application Ser. No. 10/725,779, filed on Dec. 2, 2003, which issued as U.S. Pat. No. 7,293,217 on Nov. 6, 2007, which claims the benefit of U.S. Provisional Patent Application Ser. No. 60/434,232, filed on Dec. 16, 2002, Ser. No. 60/444,068, filed on Jan. 30, 2003, Ser. No. 60/470,921, filed on May 15, 2003, and Ser. No. 60/494,404 filed on Aug. 11, 2003, which are incorporated by reference herein as if fully set forth herein.

FIELD OF THE INVENTION

This invention generally relates to the use of Turbo codes in general, and, more particularly to a method for detecting and correcting performance degradation in punctured Turbo codes using a Turbo encoder.

BACKGROUND

Wireless communication systems are well known in the art. Generally, such systems comprise communication stations that transmit and receive wireless communication signals between each other. Typically, base stations are provided which are capable of conducting wireless concurrent communications with a plurality of subscriber stations. In Code Division Multiple Access (CDMA) systems specified by the Third Generation Partnership Project (3GPP), base stations are called Node Bs, subscriber stations are called User Equipments (UE) and the wireless interface between the Node Bs and UEs is known as the Uu interface. FIG. 1 illustrates a typical 3GPP CDMA system.

The Uu radio interface of a 3GPP communications system uses Transport Channels (TrCH) for transfer of user data and signaling between UEs and Node Bs. In 3GPP Time Division Duplex (TDD) communications, TrCH data is conveyed by one or more physical channels defined by mutually exclusive physical resources. TrCH data is transferred in sequential groups of Transport Blocks (TB) defined as Transport Block Sets (TBS). Each TBS is transmitted in a given Transmission Time Interval (TTI) which may span a plurality of consecutive system time frames. A typical system time frame is 10 milliseconds and TTIs are currently specified as spanning 1, 2, 4 or 8 of such time frames.

FIG. 2 illustrates the processing of TrCHs in TTD mode into a Coded Composite TrCH (CCTrCH) and then into one or more physical channel data streams in accordance with 3GPP TS 25.222 v3.8.0. Starting with the TB of data, Cyclic Redundancy Check (CRC) bits are attached and TB concatenation and code block segmentation is performed. Convolution coding or turbo coding is then performed, but in some instances no coding is specified. The steps after coding, include radio frame equalization, a first interleaving, radio frame segmentation and rate matching. The radio frame segmentation divides the data over the number of frames in the specified TTI. The rate matching function operates by means of bit repetition or puncturing and defines the number of bits for each processed TrCH which are thereafter multiplexed to form a CCTrCH data stream.

The processing of the CCTrCH data stream includes bit scrambling, physical channel segmentation, a second interleaving and mapping onto one or more physical channels. The number of physical channels corresponds to the physical channel segmentation. For uplink transmissions, UE to Node B, the maximum number of physical channels for transmission of a CCTrCH is currently specified as two. For downlink transmissions, Node B to UEs, the maximum number of physical channels for transmission of a CCTrCH is currently specified as sixteen. Each physical channel data stream is then spread with a channelization code and modulated for over air transmission on an assigned frequency.

In the reception/decoding of the TrCH data, the processing is essentially reversed by the receiving station. Accordingly, UE and Node B physical reception of TrCHs require knowledge of TrCH processing parameters to reconstruct the TBS data. For each TrCH, a Transport Format Set (TFS) is specified containing a predetermined number of Transport Formats (TF). Each TF specifies a variety of dynamic parameters, including TB and TBS sizes, and a variety of semi static parameters, including TTI, coding type, coding rate, rate matching parameter and CRC length. The predefined collection of TFSs for the TrCHs of a CCTrCH for a particular frame is denoted as a Transport Format Combination (TFC).

Receiving station processing is facilitated by the transmission of a Transport Format Combination Indicator (TFCI) for a CCTrCH. 3GPP optionally provides for "blind transport format detection" by the receiving station, in which case the receiving station considers the potential valid TFCIs. Where there is only one valid TFCI, that TFCI is used in either case.

In 3GPP, time slot transmissions are made in predefined bursts where the transmitted physical channel data is divided into a beginning time slot portion and an ending time slot portion. A selected midamble is included between the two physical channel data portions. The TFCI is currently specified as transmitted in two parts on either side of the midamble and also between the two physical channel data portions. Two examples from 3GPP TR 25.944 V3.5.0 are illustrated in FIGS. 3 and 4 respectively where the block labeled MA represents the midamble and the block labeled T represents the parts of the TFCI. In FIG. 4, the CCTrCH is mapped to two physical channels, but only one physical channel includes the TFCI.

FIGS. 5A, 5B and 6 are diagrams of channel coding and multiplexing examples in accordance with 3GPP Frequency Division Duplex (FDD) specifications.

The various encoding steps implemented in communication systems play a key role in both performance and capacity of a wireless telecommunications systems. In particular, the turbo coding of the data being processed for wireless transmission plays a significant role for both TDD and FDD communications in a 3GPP system.

Turbo coding principles have found widespread applications in information theory and, in part, have entered into mainstream telecommunication theory and practice. These principles are used in error control, detection, interference suppression, equalization, and other communications-related areas. Turbo codes are a form of parallel, recursive systematic convolution codes, which can be used for channel coding and decoding in order to detect and correct errors that may occur in the transmission of digital data through different channels. Turbo codes are particularly useful for data transfers in which, under certain conditions, the data transfer rate can approach the theoretical limits of Shannon's Law. These favorable conditions generally include large block size transfers, which are particularly useful in mobile communications.

FIG. 7 shows how particular codes created by puncturing exhibit poorer than expected performance. As much as a 4 dB loss can be measured in the critical Signal-to-Noise Ratio (SNR) value.

Typically, high-rate Turbo codes are created by puncturing (i.e., eliminating) parity bits of a lower-rate code until the desired code rate is attained. Particular codes created by puncturing exhibit poorer than expected performance due to certain punctured bit patterns. Because the recursive encoding blocks in a Turbo encoder have an infinite impulse response, information about each systematic bit is distributed across many of the parity bits.

In any error control coding scheme that employs puncturing, the location of the punctured bits will have an impact on performance. This is because puncturing strings of successive bits can be viewed as burst errors by the decoder. All error control mechanisms can only correct burst errors that are less than some threshold. Therefore, it is important when designing the puncturing scheme that the burst error correcting abilities of the code be considered. In the absence of specific knowledge of the error control coding scheme, a good rule is to minimize the maximum string of punctured bits. For high coding rates this corresponds to distributing the non-punctured bits uniformly across the transmitted block. Puncturing schemes that uniformly distribute the non-punctured bits can deleteriously interact with certain error control codes, causing a degradation of decoder performance.

Because the recursive encoding blocks in the Turbo encoder have infinite impulse response, information about each systematic bit is distributed across many of the parity bits. The impact of certain periodic non-puncture patterns in the parity bits can be qualitatively illustrated by considering how much information remains in the surviving parity bits.

Regions where performance of the punctured Turbo code is degraded can be determined by measuring how close the puncturing pattern is to being periodic with period related to the period of the semi-periodic impulse response of the recursive encoding blocks of the Turbo encoder.

For a 3GPP Turbo encoder, the constituent recursive encoders have an impulse response that is periodic with a period of 7 symbols for positive time (semi-periodic). This can readily be seen by interpretation of the encoder as an M-sequence generator, i.e., if the shift register starts in the zero state and a one is applied only at t=0, then the encoder is exactly a Linear Feedback Shift Register (LFSR) with an associated 3rd order primitive polynomial and initial state {1 0 0}, thus a period $2^3-1=7$ M-sequence is generated for positive time.

The encoder is a Linear Time Invariant (LTI) system on a binary field. Therefore, the output of the encoder is a sum of shifted versions of the impulse response of the encoder, each shifted impulse response corresponding to the locations of the 1's in the TB. If we consider an input that is all 0's for t>T, then the output of the constituent recursive encoding block will also be semi-periodic for t>T.

Certain non-puncturing periods may result in a loss of distributed information about a small group of bits across the set of parity bits. For example, let the TB consist of 7 bits followed by many zeros. Now consider the problem of trying to determine the seven bits by observation of the output of one encoder after heavy puncturing. Each observation is made at the output is a sum of a subset of the 7 bits, the subset being determined by the non-puncture period and the impulse response of the recursive encoding block. For most non-puncture patterns (those that have a period relatively prime with the period of the semi-periodic impulse response), sums over 7 different subsets can eventually be observed. Therefore, a system of 7 equations with 7 unknowns can be formed. Assuming they are linearly independent, the values of the 7 bits may be determined. However, consider the case where the non-puncture period is simple (one surviving parity bit per period) and the same as the period of the recursive encoding block, 7. Then every observation for t>6 is the sum of the same subset of the 7 bits and so no new information is obtained, i.e., a rank-1 system of equations is formed and a unique solution does not exist. This is due to the periodic nature of the signal. When the non-puncture period is relatively prime with the period of the recursive encoding block, a series of observations of the parity bits will eventually form a rank-7 system of equations. For our 7-bit group, this is sufficient to uniquely determine the bits, i.e., information sufficient to determine the bits is distributed across the surviving parity bits. When the periods are not relatively prime, the rank of the system becomes L/K where L is the period of the recursive encoding block and K is the Greatest Common Divider (GCD) of L and N where N is the period of the non-puncture pattern.

In the above illustration, a long sequence of zeros after the small group of bits was supposed to follow for clarity sake. However, allowing additional groups of bits to follow the first group does not add to the distributed information about earlier groups. This can be seen from the causality of the system.

It is also possible that some distributed information is lost even for non-simple periods, e.g., consider the case where the non-puncture pattern alternates between a simple period of three and four. This results in a period 7 non-puncture pattern but with two surviving parity bits per period. The same argument above leads to a rank-2 system of seven equations which is still insufficient to uniquely determine the group of bits, but does reduce the dimension of the space they may span. Clearly, some information about the small group of bits is lost for some non-punctured patterns.

In order to obtain adequate performance, it is necessary to detect, avoid and/or correct the problematic puncturing patterns in the parity bit streams without having to avoid code rates. Typically, problematic interactions occur between the Turbo coder output and puncturing in the rate matching stages.

It would be desirable to have a method for creating high-rate Turbo codes that avoids problematic interactions by modifying the puncturing patterns.

SUMMARY OF THE INVENTION

According to the present invention, degradations in quality of punctured error correction coded transmissions are identified and the code transmissions are modified accordingly. A puncturing pattern which approximates a particular code rate is identified, and a value for anticipated degradation is adjusted in accordance with a matching of the puncturing pattern and the particular code rate.

For both FDD and TDD, two stages of rate matching and two puncturing operations are included, and this is done because of a certain technique called, incremental redundancy, which allows for a wireless transmit/receive unit (WTRU) to receive and soft combine multiple transmissions of the same TB from the base station. If the transmission fails the first time, the signal is retransmitted with more data in an attempt to obtain a successful communication the second time. In order to do that, two different stages of puncturing are used because the WTRU has certain capabilities, certain buffer sizes that it can support, and in order to be able to fit the retransmissions that are combined into the buffer, there are two stages of puncturing. The first stage of rate matching punctures enough bits such that the surviving bits fit into a buffer, and the second stage of puncturing (or repetition) is to achieve the desired overall code rate. When the two stages of rate matching are combined, a plot of problematic regions of coding rate is a multidimensional plot. Thus, there are two rates now involved, which are a rate in a first stage of puncturing and a rate in a second stage of puncturing.

According to a first embodiment of the present invention, P1/P2 puncturing biasing for a single stage of rate matching is implemented using the punctured error correction coded transmissions.

According to a second embodiment, two or more stages may be employed at each stage of rate matching for detecting and correcting performance in punctured Turbo codes on a High Speed Downlink Shared Channel (HS-DSCH) in R5 High Speed Downlink Packet Access (HSDPA).

BRIEF DESCRIPTION OF THE DRAWINGS

A more detailed understanding of the invention may be had from the following description of a preferred embodiment, to be understood in conjunction with the accompanying drawing wherein:

FIGS. 5A, 5B and 6 are diagrams of channel coding and multiplexing examples in accordance with 3GPP FDD specifications;

DETAILED DESCRIPTION OF THE PREFERRED EMBODIMENT(S)

In accordance with the present invention, several methods and embodiments are disclosed for detecting, avoiding and/or correcting the problematic puncturing patterns in the parity bit streams without having to avoid code rates.

The present invention is potentially applicable to layers 1 and 2 in a FDD, CDMA 2000 and TDD Universal Mobile Telecommunications System (UMTS) modes of transmission as well as other modes of transmission. Additionally, methods are described hereinafter for modifying the puncturing patterns such that performance of degraded Turbo code is restored.

In accordance with the present invention, the methods disclosed herein may be implemented in a wireless transmit/receive unit (WTRU) and/or a base station. Hereinafter, a WTRU includes but is not limited to a UE, mobile station, fixed or mobile subscriber unit, pager, or any other type of device capable of operating in a wireless environment. When referred to hereafter, a base station includes but is not limited to a base station, Node-B, site controller, access point or other interfacing device in a wireless environment.

Figure 1:
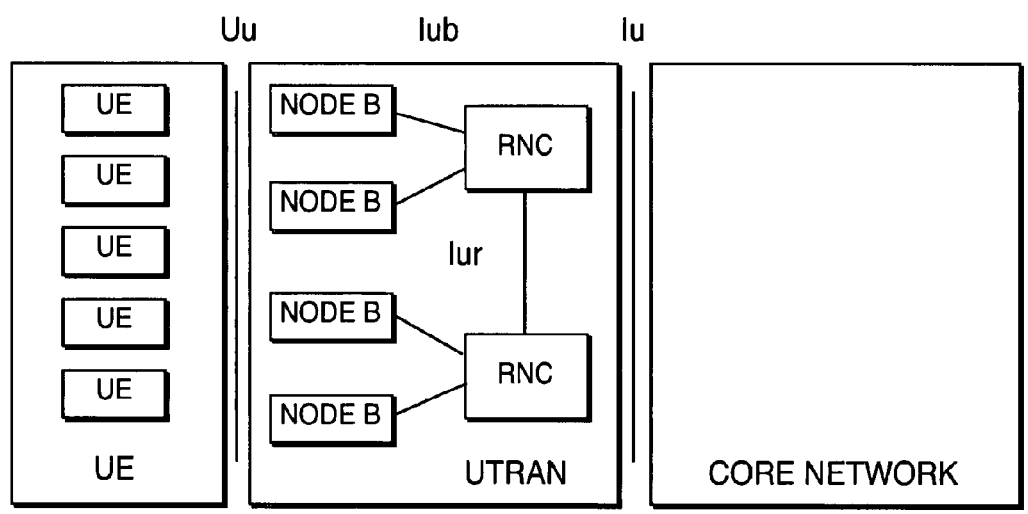
FIG. 1 is a schematic diagram of a typical CDMA system in accordance with current 3GPP specifications.
Figure 2:
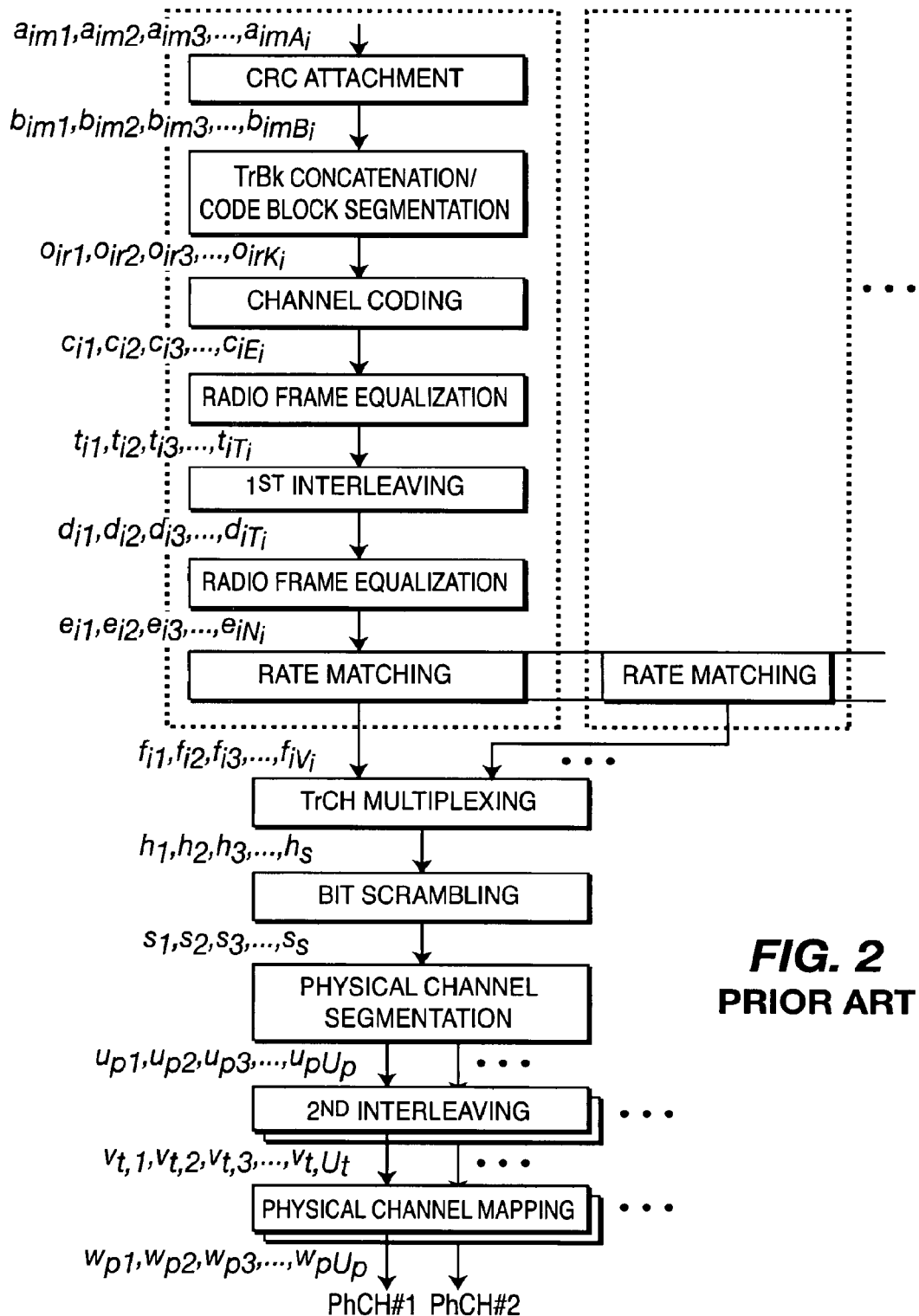
FIG. 2 is a processing diagram of TrCH data for a CCTrCH in accordance with 3GPP TDD specifications.
Figure 3:
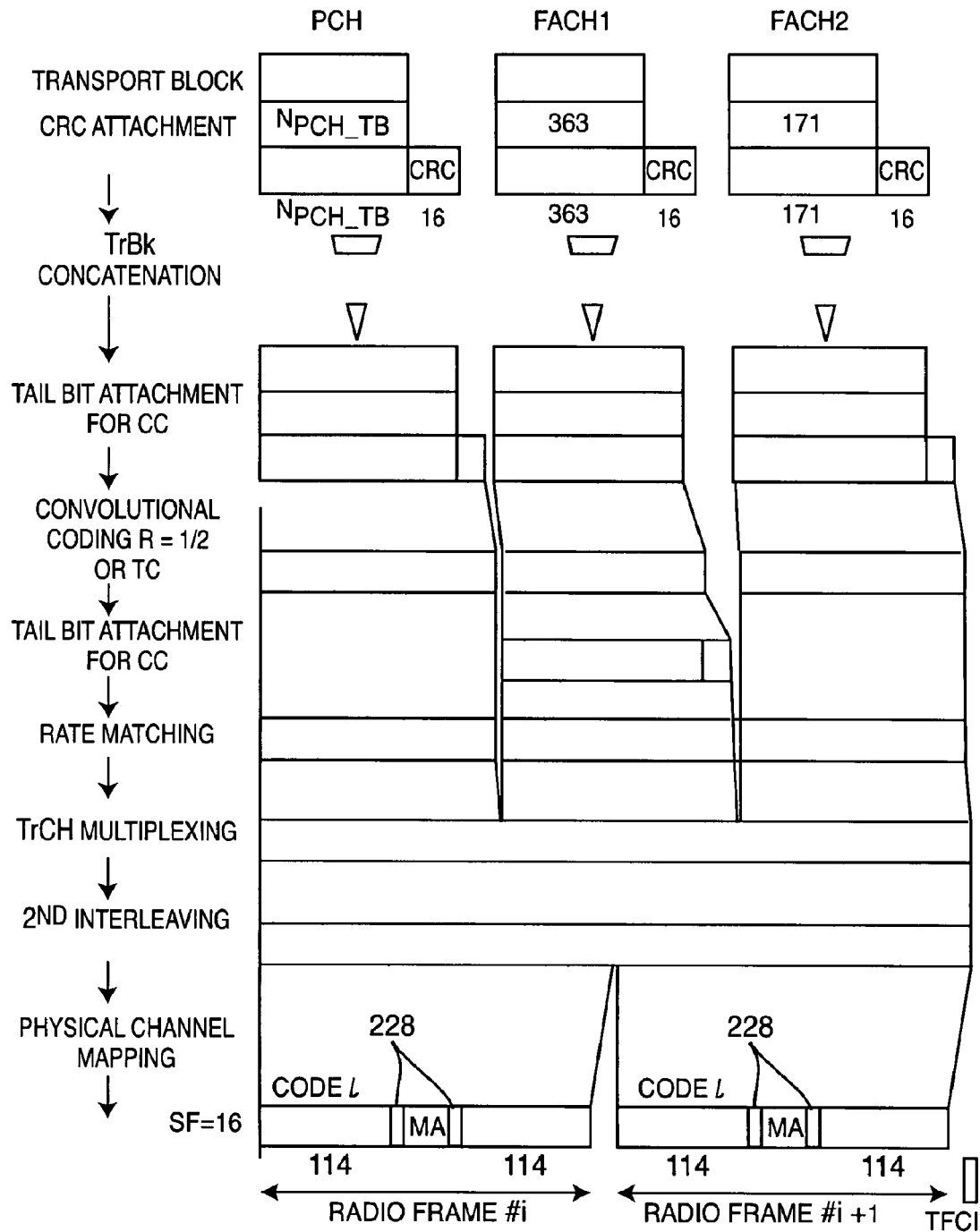
FIGS. 3 and 4 are diagrams of channel coding and multiplexing examples in accordance with 3GPP TDD specifications.
Figure 4:
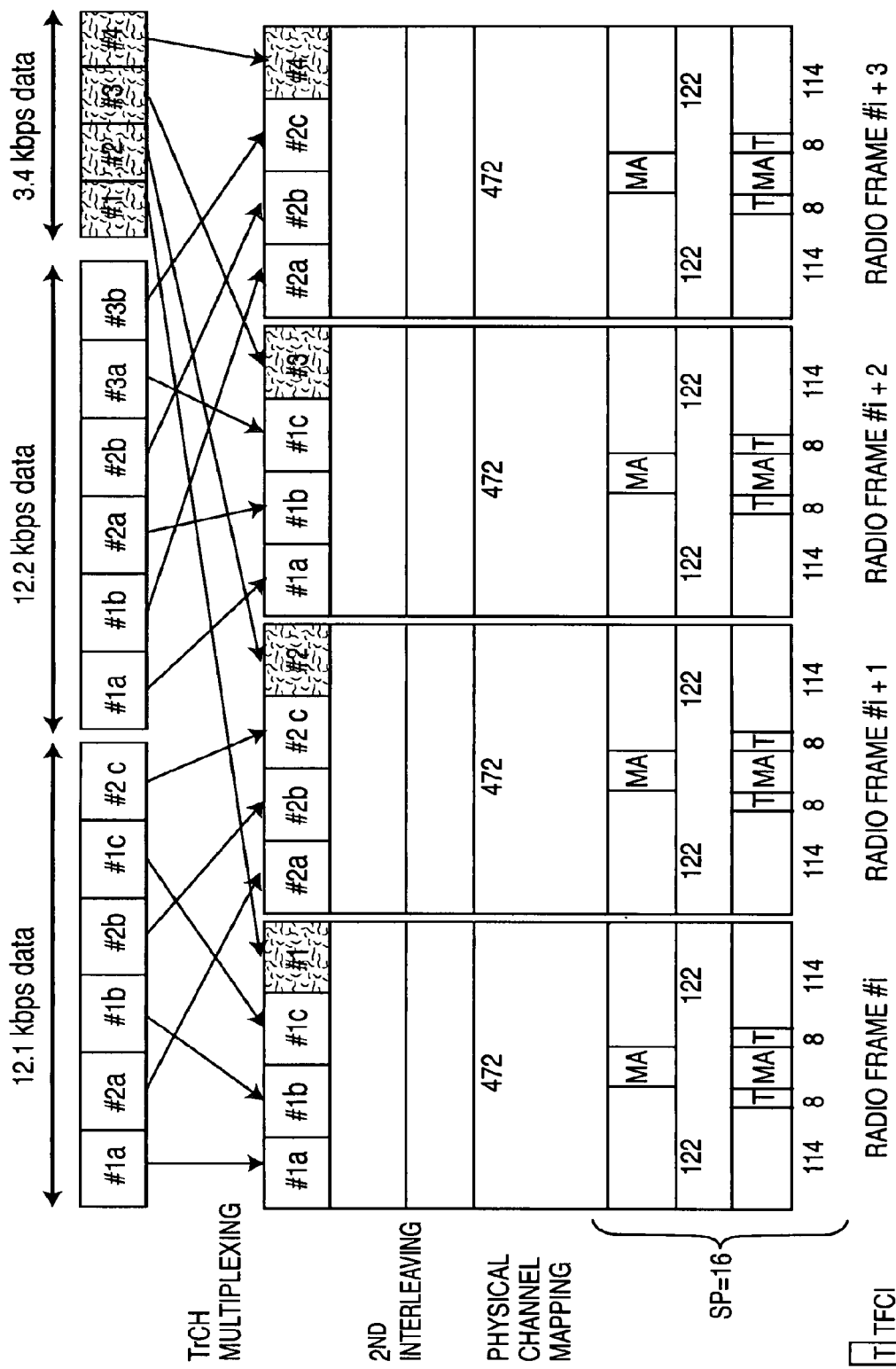
Figure 5B:
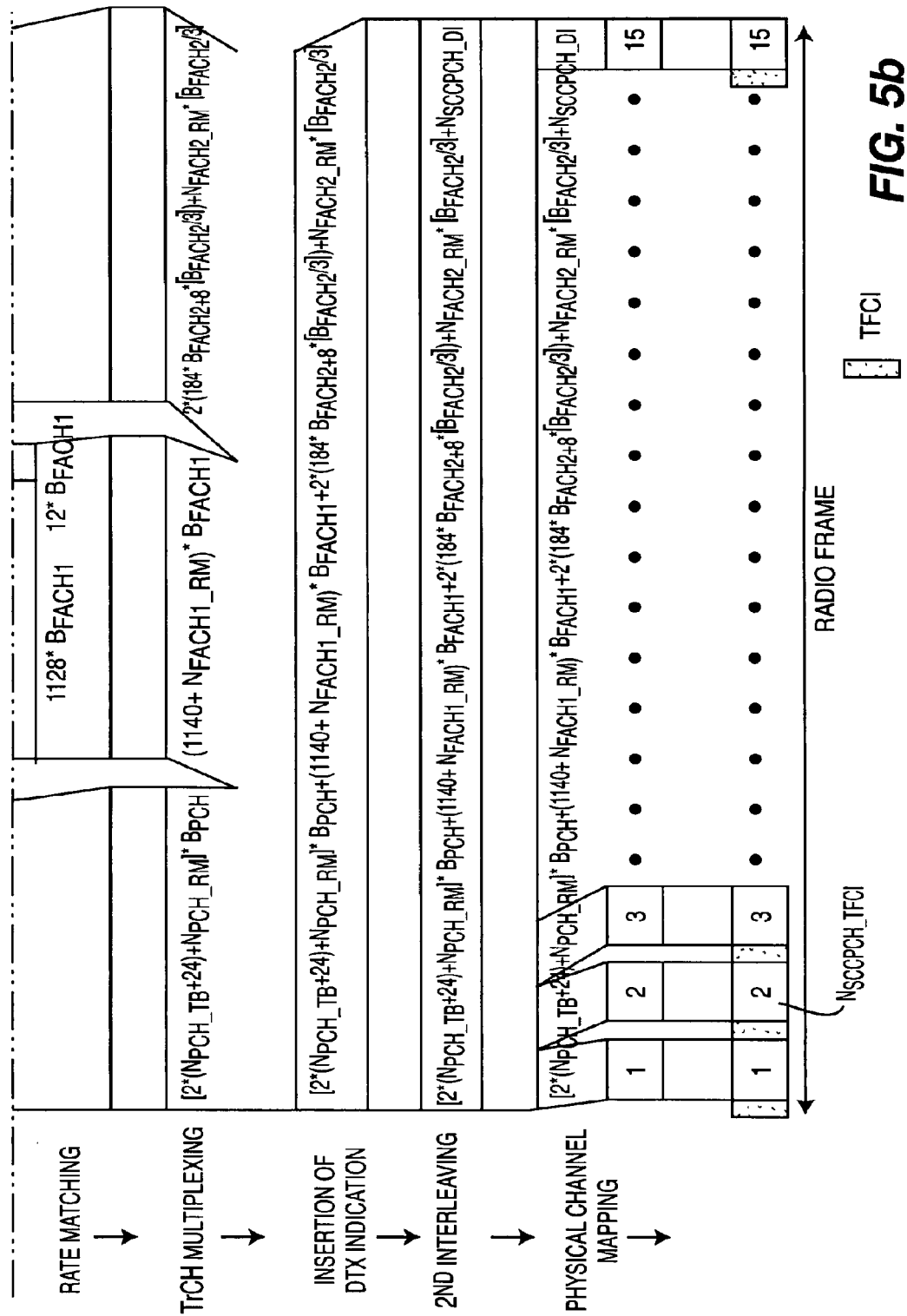
Figure 6:
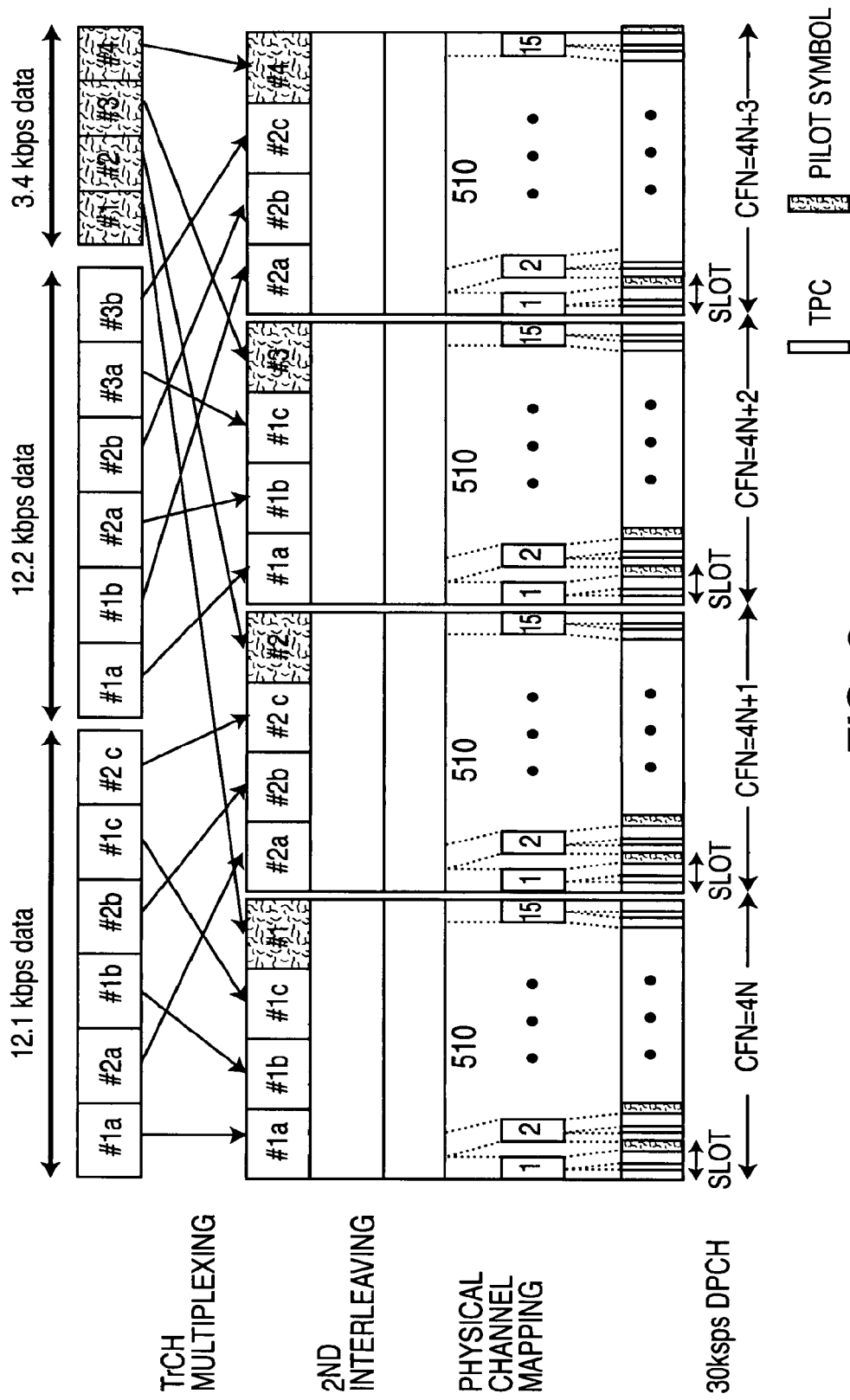
Figure 7:
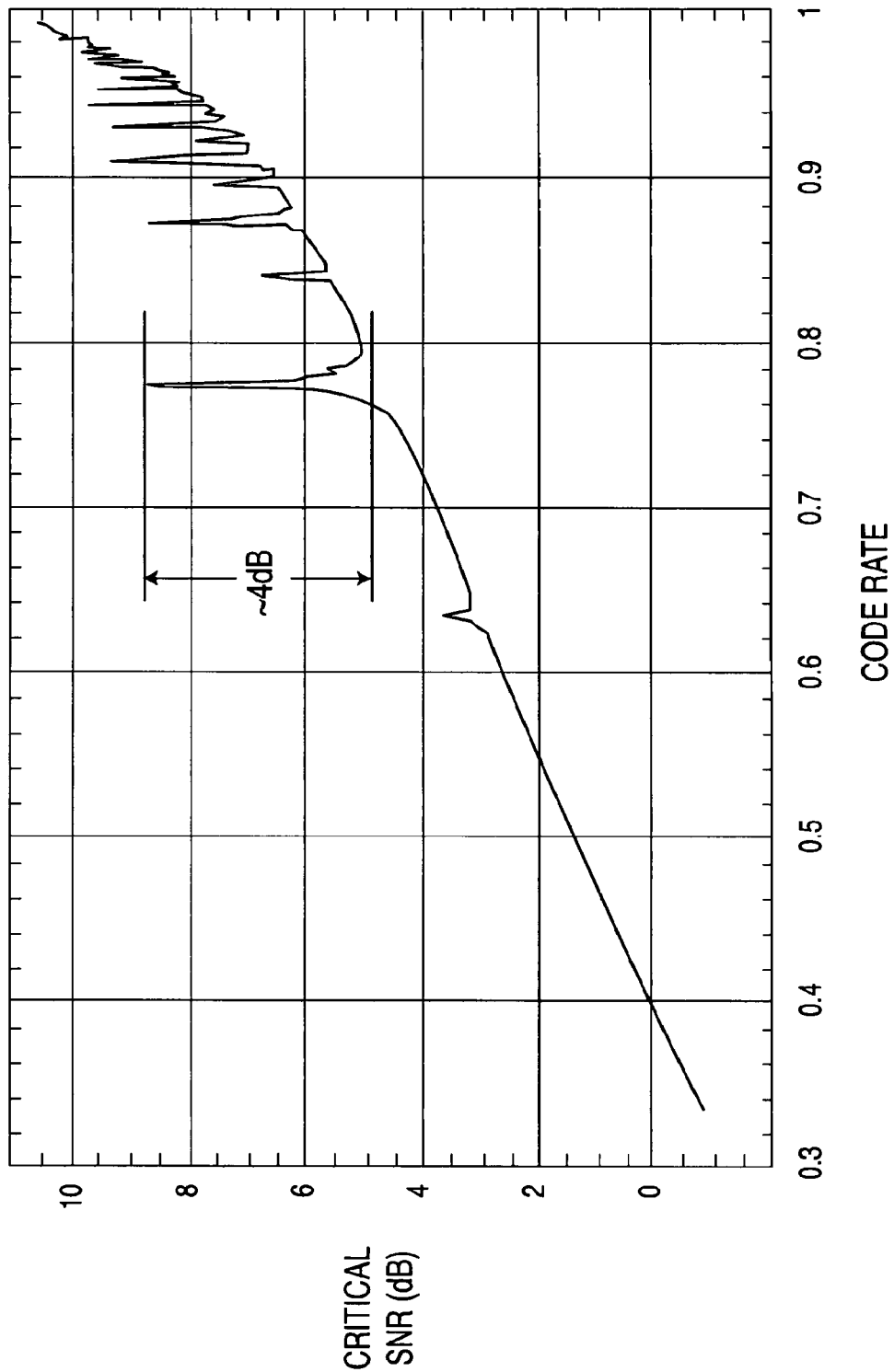
FIG. 7 shows typical results of particular codes being created by puncturing, where as much as 4 dB loss can be measured in critical SNR value.
Figure 8:
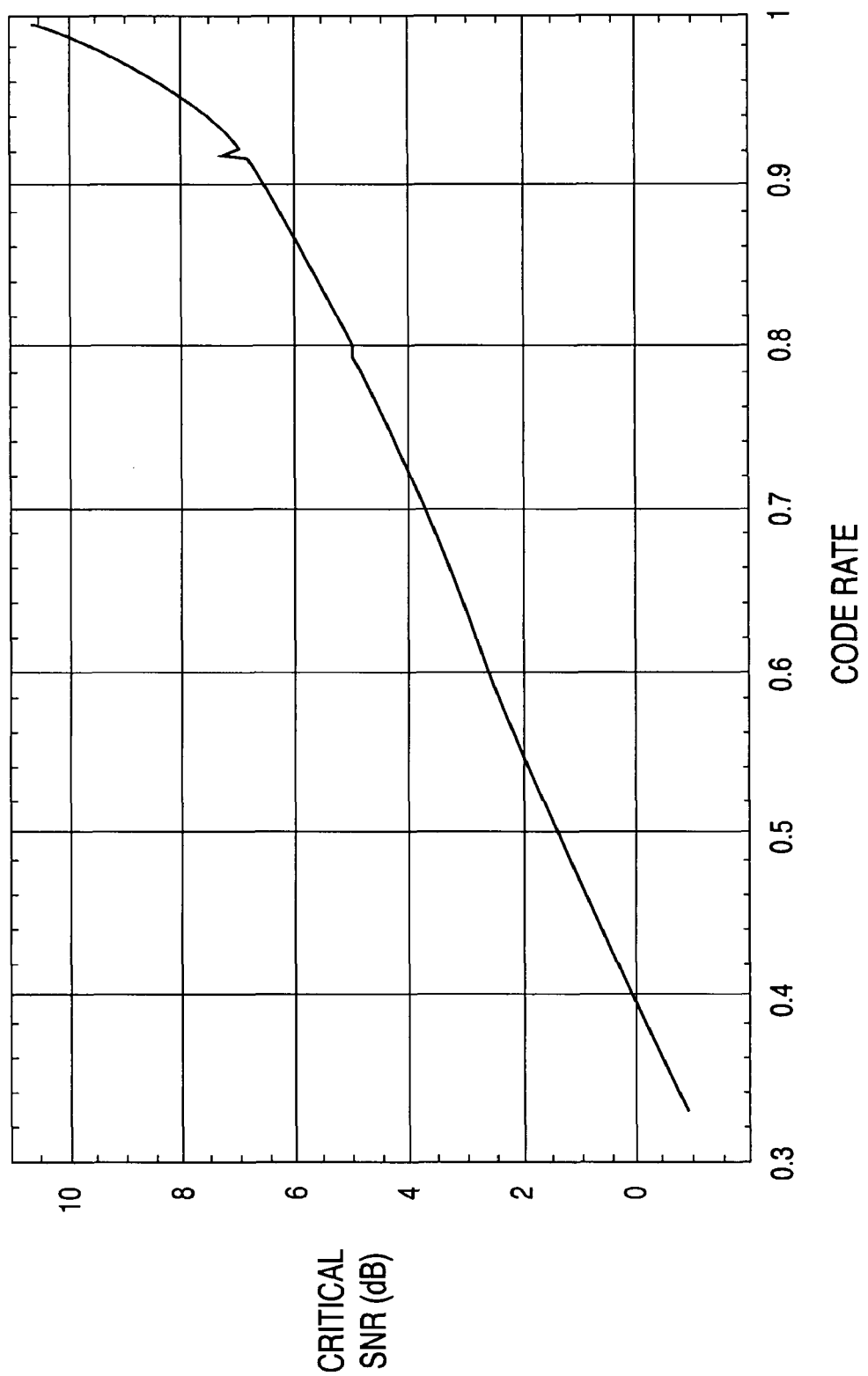
FIG. 8 graphically depicts the SNR required to successfully decode a data block (critical SNR) with high probability vs. Code Rate when P1/P2 biasing is applied.

FIG. 8 graphically depicts the SNR required to successfully decode a data block (critical SNR) with high probability versus Code Rate when biasing of parity bits P1/P2 is applied. As shown in FIG. 7, it has been found that particular codes created by puncturing the rate ⅓ 3GPP Turbo code exhibit poorer than expected performance, as can be seen from the peaks in the figure.

Figure 9:
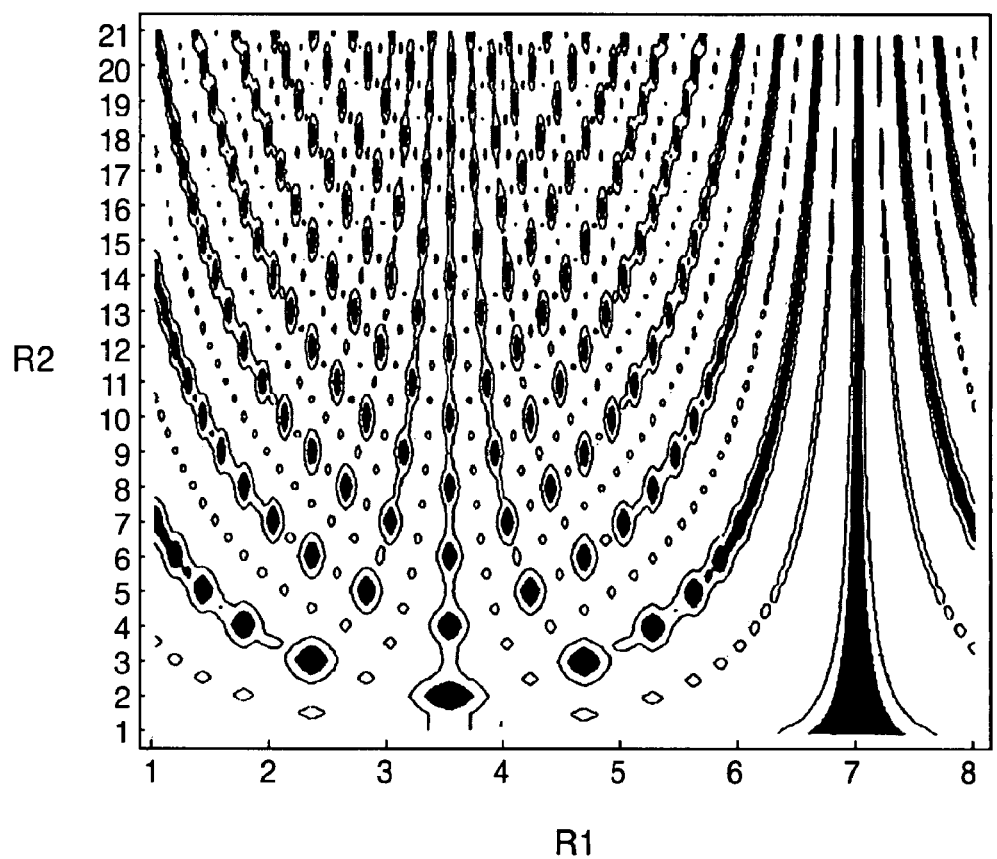
FIG. 9 is a plot of the problematic regions with respect to an ordered pair (r1,r2) which are the rates of puncturing the parity streams in the first and second stages of rate matching, respectively.

FIG. 9 is a plot of the problematic regions with respect to an ordered pair (r1,r2) which are the rates of puncturing the parity streams in the first and second stages of rate matching, respectively. As can be seen, there are particular regions where the rates of puncturing of the parity streams are such that some combinations of rates are particularly problematic.

Figure 10:
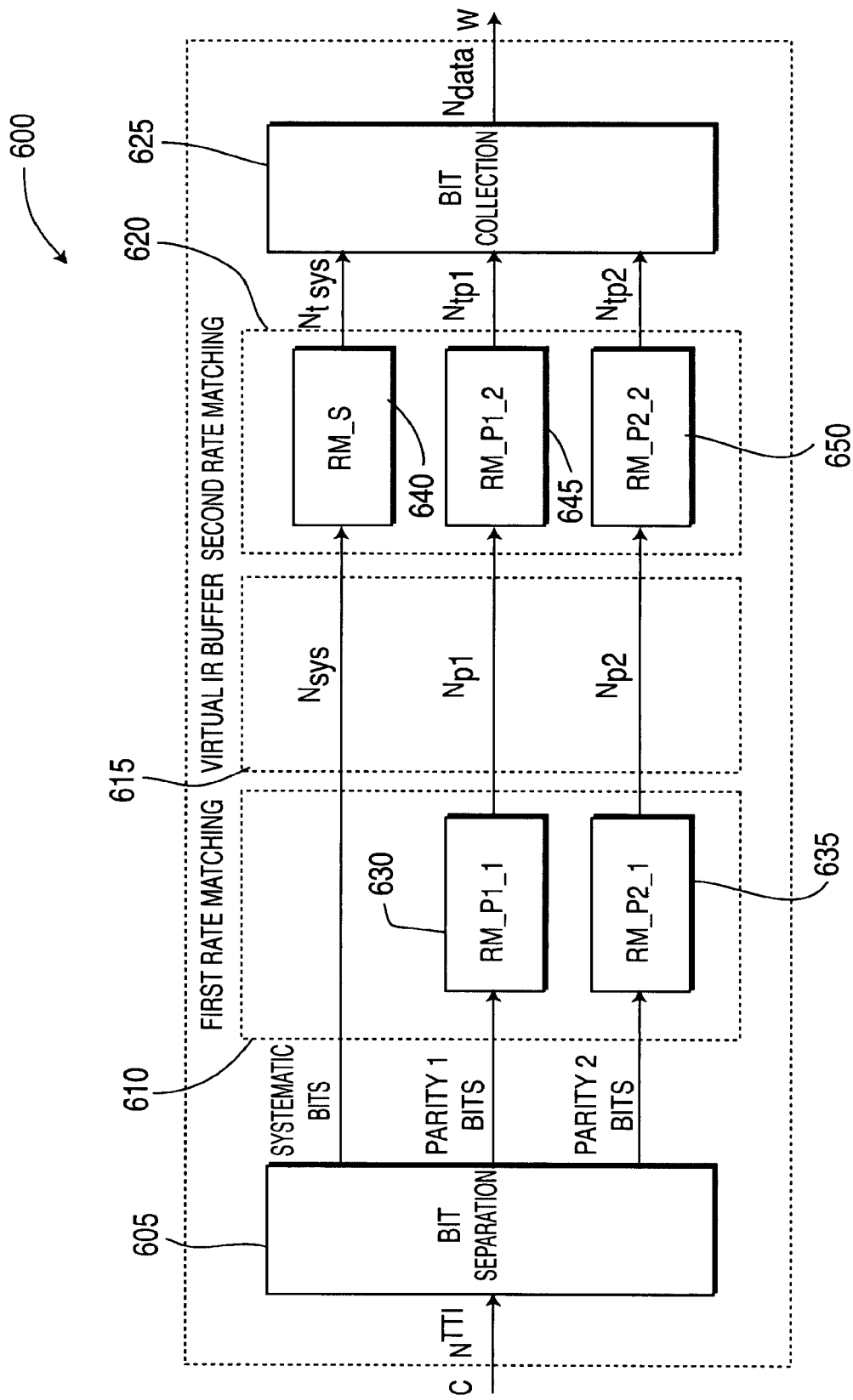
FIG. 10 is a schematic block diagram showing a circuit for 3GPP rate matching for HSDPA, using a Turbo coded HS-DSCH.

In one embodiment, puncture biasing for parity bits P1 and P2 is implemented for one stage rate matching. FIG. 10 is a schematic block diagram showing circuitry 600 for 3GPP rate matching for HSDPA, using a Turbo coded HS-DSCH. The circuitry 600 implements a 3GPP rate-matching scheme for HSDPA. The circuitry 600 includes a bit separation circuit 605, a first rate matching stage 610, a virtual incremental redundancy (IR) buffer 615, a second rate matching stage 620 and a bit collection circuit 625. The first rate matching stage 610 includes a Parity 1 (P1) bit rate matching circuit 630 and Parity 2 (P2) bit rate matching circuit 635. The second rate matching stage 620 includes a systematic bit rate matching circuit 640, a Parity 1 (P1) bit rate matching circuit 645 for the second rate matching and a Parity 2 (P2) bit rate matching circuit 650 for the second rate matching. In operation, the systematic bits, Parity 1 (P1) and Parity 2 (P2) bits are processed through the first rate matching stage 610, virtual IR buffer 615, second rate matching stage 620 and bit collection circuit 625. Note that the Parity 1 (P1) and Parity 2 (P2) bits are treated separately. The systematic bits, Parity 1 (P1) and Parity 2 (P2) bits are combined at the bit collection circuit 625 to provide a single data output $N_{data}$. Also note that if the number of coded bits is less than or equal to the size of the virtual IR buffer 615, the first rate matching stage 610 is transparent. The transparent first stage case and Rel-4 rate matching are considered.

In its actual implementation, it is anticipated that the different circuit functions will be executed by a common circuit or circuits, such as microprocessor circuitry, and in accordance with program instructions. The specific circuit functions used to implement the invention would therefore be a matter of choice of those configuring the circuitry within the rate matching circuitry 600.

The rate matching algorithm performs puncturing if the overall code rate is greater than ⅓ and repetition if the code rate is less than ⅓. Currently code rates greater than ⅓ are accomplished by applying the same puncturing rate to both P1 and P2 bits (to within one bit) but with different puncturing pattern phases. In order to avoid non-puncturing periodicities that have been shown to degrade the Turbo code performance, the puncturing rates for P1 and P2 be independently biased. For example, if the number of P1 bits is decreased by Δ and the number of P2 bits is increased by Δ, the overall code rate is unchanged but the problematic non-puncturing periods can be avoided. Given this approach to avoiding the problematic code rates, an analytical expression for the requisite bias, has been derived.

A simple and efficient method of modifying the puncture patterns is biasing the number of punctured bits in P1 and P2 by adding additional puncturing to one and removing it from the other. The amount of the bias should be no more than is needed to avoid certain periodicities. In biasing the puncturing rates of P1 and P2 bits, two constraints must be met.

When non-puncturing patterns with period $7\hat{N}/2$ ($\hat{N}=1, 2, 3\ldots$) are used, degradation in performance results. These non-puncturing patterns periods will be employed whenever the average non-puncturing period of P1 or P2 bits is within $\pm 1$ or $\pm \frac{1}{2}$ of $7\hat{N}/2$ for even and odd $\hat{N}$ respectively.

The average non-puncturing rate of the P1 and P2 rate matching blocks is $I/(P/2)$ where I is the number of bits at the input to each branch of rate matching and P is the total number of parity bits (P1 and P2) at the output of rate matching. Therefore, the desired code rate will lead to a problematic puncturing pattern if, $$\left| \frac{I}{(P/2)} - \frac{7\hat{N}}{2} \right| < 1 - \frac{\hat{N}}{2} + \left\lfloor \frac{\hat{N}}{2} \right\rfloor, \quad \text{Equation 1}$$

for $\hat{N} > 0$ where, $$\hat{N} = \left\lfloor \frac{4I}{7P} + \frac{1}{2} \right\rfloor. \quad \text{Equation 2}$$

In biasing the puncturing rates of the parity bit streams 1 and 2, P1 and P2, two constraints must be met.

First, the number of surviving bits in parity bit stream 1 must be increased sufficiently by an amount $\Delta$ to avoid the problematic puncturing patterns. Second, the number of surviving bits in parity bit stream 2 must be decreased by an equal amount $\Delta$ that is also sufficient to avoid problematic puncturing patterns.

These two constraints can be combined in to the following expression for $\Delta$, where:

$$\Delta = \left\lceil \max \left\{ \frac{I}{\left\lfloor \frac{7\hat{N}-1}{2} \right\rfloor} - \frac{P}{2}, \frac{P}{2} - \frac{I}{\left\lfloor \frac{7\hat{N}+1}{2} \right\rfloor} \right\} \right\rceil \quad \text{Equation 3}$$

Alternatively, non-punctured bits may be increased in P2 and decreased in P1. The procedure to determine and apply the necessary P1/P2 bias is as follows:

Step 1) Compute $\hat{N}$ using Equation 2.
Step 2) Determine if the desired code rate results in a problematic puncturing pattern using Equation 1. If it does, continue to Step 3, otherwise set $$\Delta = 0 \left( \text{if } \left| \frac{I}{(P/2)} - \frac{7\hat{N}}{2} \right| \geq 1 - \frac{\hat{N}}{2} + \left\lfloor \frac{\hat{N}}{2} \right\rfloor \right).$$

Step 3) Compute the bias $\Delta$ using Equation 3.
Step 4) Compute rate matching parameters by modifying Table in TS25.212/222.

In order to avoid puncturing patterns that degrade Turbo code performance, the amount of puncturing applied to parity bit streams 1 and 2 respectively could be slightly different, while keeping the overall number of punctured bits constant.

If the number of punctured bits in parity bit stream 1 is decreased by $\Delta$ and accordingly, the number punctured bits in parity bit stream 2 bits is increased by $\Delta$, the overall code rate is unchanged, but the problematic puncturing patterns can be avoided. Note that bit collection and bit de-collection stages need to be adjusted correspondingly for this case. Since individual regions of degraded performance tend to be small, it may be advantageous to simply avoid the use of code rates with degraded performance. Since code rates with degraded performance can now be identified using the above equation, it is a simple matter to avoid them.

For Hybrid Automatic Repeat reQuest (HARQ) as deployed in 3GPP, it may be necessary to employ two stages of rate matching. This occurs whenever incremental redundancy (IR) is employed and the number of bits input to the rate-matching algorithm is larger than the virtual IR buffer. Note that when Chase combining HARQ is used, there is no need for a special IR buffer; a received bit buffer would be sufficient. (If constellation rearrangement were not used, a buffer of received symbols would be sufficient.) If it is determined that IR provides only a small improvement over Chase combining, then removal of IR from the standards may be advisable.

In order to obtain higher data rates, the 3GPP has introduced the HSDPA option wherein link adaptation is performed. One component of the link adaptation is Adaptive Modulation and Coding (AMC). With AMC, a channel quality estimate is used to select the modulation type and code rate that attains the largest throughput. When the channel quality is high, QAM modulation and a high code rate are selected. High code rates are obtained by puncturing a rate $\frac{1}{3}$ Turbo code. During the design of the channel quality indication (CQI) table, it was observed that certain Transport Block Set Sizes (TBSS) exhibited poorer than expected performance. The CQI table is used to map a channel quality estimate into a recommended modulation and TBSS. This problem of poorer than expected performance is currently addressed by simply "hand tweaking" the CQI table to avoid the TBSSs that cause problems. In AMC, this leads to less than optimal throughput since optimal code rates will inevitably be avoided.

Support for link adaptation by means of AMC is an integral feature of R5 HSDPA. With AMC, modulation type and code rate on HS-DSCH can be varied according to channel conditions. Variable coding rates on HS-DSCH are achieved by means of rate matching (repetition or puncturing) output of the R99 Turbo-coder in a pre-determined manner, i.e. as a function of TBSS and available number of Physical Channel bits. Both R99/R4 and R5 use the same code rate $\frac{1}{3}$ Turbo-coder. While the principle of rate-matching is the same for both R4 and R5, the likely and more frequent use of higher effective code rates ($>\frac{1}{2}$), the use of multiple stages of rate matching, and the standard allowing for the possibility of Incremental Redundancy (IR) differentiate R99/R4 and R5.

HSDPA performance requirements in WG4 have indicated unusually high and rather unpredictable SNR performance degradations for Turbo-coded and punctured transport blocks on HS-DSCH up to several dB for a range of effective coding rates above $\frac{1}{2}$.

The Turbo-coding performance on HS-DSCH is heavily impacted by unfavorable puncturing patterns of the parity bit streams output by the baseline rate $\frac{1}{3}$ Turbo-coder. Although the original WG4 simulation results were provided in a TDD-context, exactly the same degradations also occur in FDD, the reason being that Turbo-coding and rate-matching (TS25.212 and TS25.222) on HS-DSCH transport blocks (where the problematic interactions originate) are done exactly the same way for both modes.

The poorer than expected performance at some data rates is also a problem with a fixed modulation and coding scheme. If a user is assigned a code rate that exhibits the problem, the poor performance of the code will be compensated for by power control thus reducing cell capacity.

In another embodiment, adjustments to the parity stream puncturing allows the Medium Access Control-High Speed (MAC-hs) to simply select any desired transport block size as an outcome of the scheduler decision. It would be required to slightly change the generation of the puncturing patterns in the rate-matching stages in TS25.212/222. For example, one implementing modification to the current FDD standard as set for in TS 25.212 is appended hereto along with a brief discussion of why the modification is desirable.

For both the case of $1^{st}$ rate-matching stage being transparent and the case of both $1^{st}$ and $2^{nd}$ rate-matching stage being employed, a number of acceptable solutions exist to avoid the problematic interactions by means of adjustments to the parity bit puncturing.

One of these solutions, e.g. a simple biasing method, is outlined below in the interest of providing a conceptual example for the case of the $1^{st}$ rate-matching stage being transparent.

Currently, coding rates>⅓ are accomplished by applying the same amount of puncturing to both parity bit streams 1 and 2 at the output W of the Turbo-coder (FIG. 10), although the puncturing pattern "phases" can be adjusted.

When a particular code rate is desired and it is determined that its use will result in degraded performance, a slightly lower code rate may be selected to avoid the degradation. Good choice for the substituted code rate would be the largest allowable code rate less than the desired code rate that has been determined to have an acceptable degradation.

If it is desirable for a system to be allowed to make unrestricted use of available code rates, then performance may be restored by modification of the puncture pattern. The key to restoring performance to the punctured Turbo code is to avoid the case where the surviving parity bits are overly redundant with respect to the systematic bits, i.e., modify the puncturing pattern to improve performance. One way to accomplish this is to sample the parity bits such that all the points corresponding to one complete period of the semi-periodic impulse response are sampled with as few samples as possible while maintaining the same code rate and not overly distorting the uniformity of the puncturing over the data block or creating overly large imbalances in the number of surviving parity bits in P1 and P2.

It should also be noted that this method of mitigation could also be applied to systems with more than 2 parity streams. For example, the 3GPP Turbo code (CDMA 2000) includes four parity streams. If a problematic puncturing pattern occurs it can be alleviated by adjusting the puncturing rates of each of the individual parity streams while maintaining a constant overall effective coding rate.

In the case of single stage of rate matching, as used in R99/R4 and in many R5 configurations, the problematic interactions between the Turbo-coded output and the punctured transmitted sequence occurs in regions where the puncturing patterns are nearly periodic with surviving bit period equal to a multiple of 7, and when an average 1 out of every 3.5 parity bits survive.

These degradations correspond to rank-1 and rank-2 scenario respectively. This case corresponds to the rank-1 scenario. Rank-2 scenarios have less impact on the SNR degradation than rank-1 scenarios. Since higher rank scenarios (>2) do not significantly contribute to performance degradation, ranks other than rank-1 and rank-2 scenarios are not considered here.

The code rates at the center of these regions are determined by:

$$CR = \frac{1}{1 + \frac{2}{3.5N}} = \frac{3.5N}{3.5N + 2} \qquad \text{Equation 4}$$

$$N = 1, 2, \ldots$$

The critical code rate, CR, corresponds to a rank-1 scenario when N is even and rank-2 when N is odd. For rank-1, we have critical code rates CR=7/9, 7/8, 21/23, . . . and for rank-2, we have CR=7/11, 21/25, . . . .

The ratio of the number of systematic bits and the number of parity bits in either parity bit stream 1 or 2 can be considered as "parity puncturing rate". When surviving bit patterns with parity puncturing rate close or equal to 7N/2 (N=1, 2, 3 . . . ) are used, degradation in performance results. Some amount of Turbo-coding and puncturing interaction will also occur whenever the average periodicity of surviving bits of the parity bit streams 1 or 2 is within ±1 or ±½ of 7N/2 for even and odd N respectively.

When two (or more) stages of rate matching are employed, problematic puncturing patterns can be generated by any stage, or by the interaction between the stages of rate matching.

A closed form expression(s) has been developed for the Release 5 3GPP Turbo coder/Rate Matching that predicts the performance degradation. The expression takes as input either the triplet {Bits Before $1^{st}$ stage of rate Matching, Max Bits after $1^{st}$ Rate Matching, Bits after $2^{nd}$ Rate matching} or the pair {Rate of $1^{st}$ stage Rate Matching with respect to parity bits, Rate of $2^{nd}$ stage Rate Matching with respect to parity bits}. The output, as depicted in Equation 5 below, is a rational number that may be compared to a threshold to accept/reject the configuration as providing/not providing acceptable performance. The parameters r1 and r2 represent the rates associated with the $1^{st}$ and $2^{nd}$ stages of rate matching with respect to the parity bit streams. Although complicated, the Equation 5 is a piecewise linear and continuous function in r1, r2 and is therefore trivial to evaluate.

$$\lambda(r1, r2) = \qquad \text{Equation 5}$$

$$\sum_{n=1}^{L-1} \alpha_n \Bigg[ \left(1 - \left[\frac{1}{L}\lceil r1\lceil nr2\rceil\rceil - \left\lfloor\frac{1}{L}\lceil r1\lceil nr2\rceil\rceil\right\rfloor\right]\right)(nr2 - \lfloor r2 \rfloor)$$

$$(r1\lceil nr2\rceil - \lfloor r1\lceil nr2\rceil\rfloor) +$$

$$\left(1 - \left[\frac{1}{L}\lfloor r1\lceil nr2\rceil\rfloor - \left\lfloor\frac{1}{L}\lfloor r1\lceil nr2\rceil\rfloor\right\rfloor\right]\right)$$

$$(nr2 - \lfloor nr2 \rfloor)(-r1\lceil nr2\rceil - \lfloor r1\lceil nr2\rceil\rfloor + 1) +$$

$$\left(1 - \left[\frac{1}{L}\lceil r1\lfloor nr2\rfloor\rceil - \left\lfloor\frac{1}{L}\lceil r1\lfloor nr2\rfloor\rceil\right\rfloor\right]\right)$$

$$(-nr2 + \lfloor nr2 \rfloor + 1)(r1\lfloor nr2\rfloor - \lfloor r1\lfloor nr2\rfloor\rfloor) +$$

$$\left(1 - \left[\frac{1}{L}\lfloor r1\lfloor nr2\rfloor\rfloor - \left\lfloor\frac{1}{L}\lfloor r1\lceil nr2\rfloor\rfloor\right\rfloor\right]\right)$$

$$(-nr2 + \lfloor nr2 \rfloor + 1)(-r1\lfloor nr2\rfloor + \lfloor r1\lfloor nr2\rfloor\rfloor + 1)\Bigg]$$

A threshold comparison could then be based on this equation to test whether or not the Code Rate pair will perform adequately. Equivalently, the triple: {Data Block Size, Size After 1$^{st}$ Stage Rate-Matching, Size After 2$^{nd}$ Stage Rate-Matching} can be used since this triple maps directly into the Code Rate pair.

The effect of the periodicity of the puncturing pattern can also be mitigated by interleaving the parity bits before rate-matching occurs. In this way, after de-interleaving, periodic sampling of the parity bits is avoided even when periodic sampling is done in rate-matching.

The functionality of the channel interleaver can be incorporated into the rate-matching block interleaver. This can be accomplished by adding additional constraints to the rate-matching block interleaver (those defined by the channel interleaver) when the interleaver is designed. This however will require an additional interleaver for the systematic bits.

Note that the rearrangement of the non-punctured bits only needs to occur on a range equal to the period of the semi-periodic impulse response of the recursive encoding blocks of the Turbo encoder. Therefore, small time-varying interleavers can be added to the parity bit steams to prevent problematic puncturing patterns. This has the advantage of requiring less memory and helps to minimize the distortion of the uniformity of the puncturing.

Certain parameters may be made to vary as a function of time (or bit index) to generate puncturing patterns that will mitigate performance degradations. One such example for 3GPP includes modification of the rate-matching parameters $X_i$, e_ini, e_minus and e_plus parameters throughout the execution of the rate-matching. In this way, the parameters affecting the puncturing pattern may change at one or more locations within the block of bits being punctured. By allowing the parameters to change, the instantaneous code rates may be different from the desired overall code rate (thereby avoiding the puncturing interaction) while still maintaining the same overall code rate. For example: 1) e_plus and e_minus may change frequently throughout the puncturing algorithm thus breaking up any possible long runs of deleterious puncturing. 2) Parameters may be changed so that the code rate is changed so that it is higher in some portions of the code block and lower in others.

The above methods are examples of modifications to the puncturing pattern used to generate specific code rates. All such methods may be considered special cases and specific implementations of the more general concept of a permutation of the puncturing pattern. Any method of changing the puncturing pattern, i.e., generating some permutation of the original puncturing pattern, has the potential of changing the overall performance of a code.

One can achieve the desired overall code rate while avoiding problematic puncturing patterns by adjusting the amount of puncturing performed in each stage. This method, when placed in the context of the 3GPP HSDPA Turbo Code/Rate Matching algorithm leads to artificially reducing the size of the virtual Incremental Redundancy (IR) buffer. In general the approach implies a modification to the individual puncturing rates of each of the stages such that a desirable overall puncturing pattern results.

Stage Rate Biasing is easily accomplished by changing the operating point (the r1, r2 pair) to some point on a curve of constant code rate (i.e., where the product r1*r2 is unchanged) where performance degradation is tolerable.

The combination of adjusting the stage puncturing rates as well as the relative rates of puncturing in the two parity streams can also mitigate the problematic interaction between the puncturing pattern and the Turbo Code performance.

This can be envisioned as splitting the operating point into two points. One of the points corresponds to the rates of 1$^{st}$ and 2$^{nd}$ stage rate matching for the first parity bit stream and the second point for the second parity bit stream. The two points should be selected so that the overall code rate is unchanged, both points lie in regions of acceptable performance, and the total number of surviving bits after the first stage of rate matching does not exceed imposed limits such as an IR buffer.

The present invention provides several simple and efficient techniques of detecting, avoiding and/or correcting problematic puncturing patterns in the parity bit streams without having to avoid desired code rates. According to the present invention, degradations in punctured error correction coded transmissions are reduced by identifying a puncturing pattern which approximates a particular code rate, and adjusting a value for anticipated degradation in accordance with the matching of the puncturing pattern and the particular code rate.

When creating high rate codes via puncturing, it is generally desirable to distribute, as uniformly as possible, the bits that are punctured. Using this guideline, it is inevitable that certain code rates will require the resulting non-punctured bit pattern to be less effective. One such example occurs when the non-punctured bit pattern is periodic, with a period equal to the period of the semi-periodic impulse response of the recursive encoding blocks of the Turbo encoder. An algorithm may used to identify all puncturing patterns with degraded performance.

In a particular embodiment of the invention, the capacity of a WTRU is determined, including buffer sizes that are supported by the WTRU. The puncturing is used to reduce the number of bits to fit into the buffer, and the overall code rate is adjusted so as to provide sufficient error correction capability. This provides a first rate in a first stage of puncturing and a second rate in a second stage of puncturing.

According to the present invention, detecting, avoiding and/or correcting problematic puncture patterns in parity bit streams and punctured Turbo codes is achieved without having to avoid desirable code rates. This is applicable without limitation, to FDD, TDD and other modes of transmission, and enables identification/avoidance of regions of relatively poor Turbo code performance, which might result from the prior art bit-puncturing scheme. The invention provides for forward error correction comprising Turbo coding and puncturing that achieve a smooth functional relationship between any measure of performance and the effective coding rate resulting from combining the lower rate code generated by the Turbo encoder with puncturing of the parity bits. Examples of measures of performance would be BLER, bit error rate (BER), required signal-to-interference ratio (SIR), or required SNR.

The patterns of the puncturing are created by creating an encoded transmission at a particular data rate and excluding some of the encoded bits. At the receiver end, zeros or other "filler" bits are put in place of the punctured bits, and the decoding operation is based on the received signal with the missing bits. According to the present invention, the puncturing pattern is modified in order to eliminate degradation which would occur under particular puncturing patterns. In particular, if the puncturing pattern is regular or has a periodic nature, it is more likely to result in signal degradation. By eliminating the degradation, it is possible to achieve the desired code rate.

The present invention is particularly useful for 3GPP-coding, and can be used for low chip rate TDD, high chip rate TDD and FDD.

One such example of a periodicity occurs when the non-punctured bit pattern is periodic with period equal to the period of the semi-periodic impulse response of the recursive encoding blocks of the Turbo encoder. An algorithm is provided to identify all puncturing patterns with degraded performance. Additionally, modification of the puncturing patterns is performed such that performance of the Turbo code is restored.

Modifications to puncturing are used to restore Turbo performance. If it is desirable for a system to be allowed to make unrestricted use of available code rates, then performance may be restored by modification of the puncture pattern. Therefore if it is deemed desirable for a system to be allowed to make unrestricted use of available code rates, then performance may be restored by modification of the puncture pattern.

Adaptive coding means that on the fly, information is obtained from the WTRU that indicates the channel quality. Based on that, the transmitter adjusts its code rate amongst other parameters. In instances of poor reception, a substantial amount of redundancy is added, which results in a very low code rate, but which allows transfer of data through with the required block error probability.

The channel quality estimation procedure does not inherently take into account the possibility that problematic puncturing may have been used, nor should it. The channel quality is typically based on signal power and noise power, but it does not take into account the fact that the encoder may have been punctured in a problematic way, therefore AMC will not serve to avoid problematic code rates. With good channel quality, very little coding is needed and it is possible to use a higher order modulation. If the channel quality is poor, the code rate is reduced. Therefore, a reduced data rate is used to provide the desired error performance. The channel quality indicator is used to monitor the channel quality and in turn provides input to the data rate controller.

Capacity is measured by determining a combined data rate to all users supported. If one or more users in a cell are tuned to a problematic code rate, then those users are presumed to require more power and thereby reduce capacity. In many cases the problematic coding rates are known or can be determined via this invention and therefore it is possible to avoid these rates.

The present invention provides an ability to identify problem rates in advance through some analytical means, and responding to this information by avoiding these rates either dynamically or statically. This can be achieved by detecting problematic patterns or by using a formula or table of rates to avoid. If a transmission calls for one of the problem rates, the actual transmission is provided at a rate which is slightly different. The result is, the problem rate is avoided.

These are representative examples of modifications to the puncturing pattern used to generate specific code rates, as applicable to layer 1 and layer 2 in the TDD and FDD mode of transmission in accordance with the present invention. Variations to the examples described are conceivable. All such variations may be considered special cases and specific implementations of the more general concept of a permutation of the puncturing pattern. Any method of changing the puncturing pattern, i.e., generating some permutation of the original puncturing pattern, has the potential of changing the overall performance of a code, and it is the intent to include permutations and methods of generating such permutations of the puncturing pattern envisaged in the present invention. All modifications and improvements to the basic concept of the invention as set forth hereinabove are envisaged to be within the ambit of the present invention.

Figure 11:
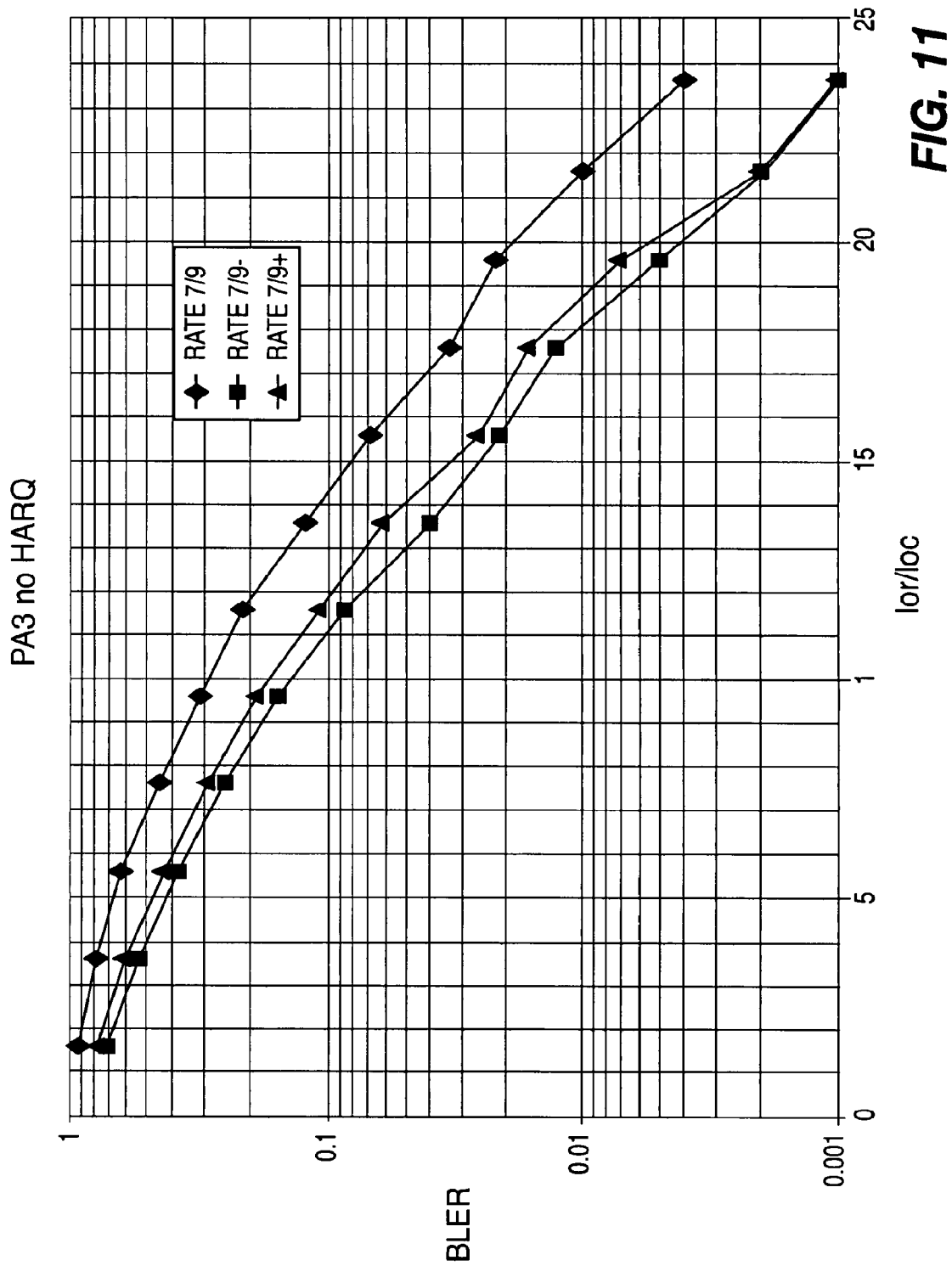
FIG. 11 graphically depicts initial Block Error Rate (BLER) for HS-DSCH transport blocks with certain effective coding rates.

FIG. 11 shows the BLER performance of 3 different HS-DSCH transport blocks of increasing size 4554, 4705 and 4858 bits respectively. All of them are rate 1/3 Turbo-coded, and then punctured down to 6072 bits mapped to the High Speed Physical Downlink Shared Channels (HS-PDSCH). This results in an effective coding rate of 0.75 (labeled 7/9-), 0.77 (labeled 7/9) and 0.80 (labeled 7/9+) for the 3 increasing transport blocks sizes.

When increasing the effective coding rate (or equivalently increasing the puncturing rate) of a Turbo-coded transport block on HS-DSCH, one should expect that BLER performance degrades in a proportioned manner, i.e. gets increasingly worse for increasingly higher effective coding rates. This unfortunately does not always happen, and it can be seen in this example that the rate 0.77 (7/9) coded transport block needs some 3 dB more SNR than a rate 0.80 coded transport block to achieve the same BLER of approximately 10%.

The reason for the observed degradations is that the periodicity (period=7) in the output of the two Turbo-coder parity bit streams, as given by the impulse responses of the constituent recursive convolutional encoders, deleteriously interacts with the periodicity of the puncturing patterns applied by the second and/or the first rate matching stages in many cases. This effect is increasingly more frequent for increasingly higher puncturing rates.

In the analyses that follow, a single R99 rate-matching block is assumed. However, the concepts apply more generally to R4 and R5 with and without incremental redundancy. The main conclusion for both cases is that the critical puncturing rates leading to SNR degradation are predictable in principle, but would require a rather complex set of parameters to be taken into account.

The setting of critical puncturing rates is avoided in the MAC-hs in the Node B, which has the particular advantage that it would not require a change in current standards and could leave details open to vendor-specific implementation. While this approach is preferable, the look-up tables used are complex and restrictions on possible MAC-hs scheduler decisions are imposed.

Alternatively, slight modifications are made to the puncturing patterns as generated by the current rate-matching stages for HS-DSCH in TS25.212/222. These modifications constitute only a small change in the way the rate matching parameters are generated in TS25.212/222, e.g., parameters for HARQ second rate matching, and more importantly do not require any additional signaling.

Due to the apparent simplicity of the second option (slight modification of the generation of the puncturing pattern on Turbo-coded parity bit streams) and its transparency for the MAC-hs scheduler (simply selects whatever transport block size is desired as outcome of the scheduler decision), a corresponding change is made in TS25.212/222 to remedy this problem.

The constituent recursive convolutional encoders in the Turbo-coder as by TS25.212/222 have infinite impulse responses that are periodic with period 7 for positive time. The impact of certain patterns of surviving (i.e. non-punctured) bits in the parity bit stream can be qualitatively illustrated by considering how much information remains in these surviving parity bits.

The Turbo-coder produces 3 bit streams, systematic bits corresponding to the input sequence, parity bit stream 1 (output of $1^{st}$ constituent encoder) and parity bit stream 2 (output of $2^{nd}$ constituent encoder).

Note that the constituent recursive convolutional encoder is an LTI system on $GF_2$. Therefore, the output of the encoder is a sum of shifted versions of the impulse response of the encoder. Each shifted version of the impulse response corresponds to the locations of the 1's in the TB.

Certain puncturing patterns may result in a loss of distributed information about a small group of bits across the set of bits in one of the parity bit streams. For example, let the TB consist of 7 bits followed by many zeros. Now consider the problem of trying to determine the seven bits by observation of the output of one encoder after heavy puncturing. Each observation made at the output is a sum of a subset of the 7 bits. The subset for each particular observation is determined by the surviving bit period and the impulse response of the recursive encoding block.

For most puncture patterns, sums over 7 different subsets of the 7 bits can eventually be observed. Therefore, a system of 7 equations with 7 unknowns can be formed. Assuming that they are linearly independent, the values of the 7 bits may be determined.

However, when the periodicity of surviving bits is simple (one surviving parity bit per period) and the same as the period of the recursive encoding block, 7, then, due to the periodicity of the signal, every observation for t>6 is the sum of the same subset of the 7 bits and so no new information is obtained by subsequent observations. Thus, a rank-1 system of equations is formed and a unique solution does not exist.

When the periodicity of surviving bits is not a multiple of 7, making observations of the parity bits will eventually form a rank-7 system of equations after several observations. For our 7-bit group, this is sufficient to uniquely determine the bits, i.e. information sufficient to determine the bits is distributed across the surviving parity bits.

It is also possible that some distributed information is lost even for non-simple periods, e.g., consider the case where the non-puncture pattern alternates between a simple period of three and four (two surviving parity bits per period with period=7).

This results in a period 7 non-puncture pattern but with two surviving parity bits per period. The same argument above leads to a rank-2 system of seven equations. This is still insufficient to uniquely determine the group of bits, but does reduce the dimension of the space they may span. Clearly, some information about the TB may also be lost for non-simple surviving bit patterns.

At least two alternative approaches exist to avoid the problematic interactions between Turbo-coder output and puncturing in the rate-matching stages.

The avoidance of problematic puncturing patterns is an approach that requires the MAC-hs to avoid using puncturing patterns that lead to SNR degradation and does not use certain combinations for mapping incoming transport blocks sizes to HS-PDSCHs.

Avoidance would either require building lookup tables that identify the problematical configurations or evaluating the predicted degradation expression described previously in the MAC-hs scheduler.

An advantage of the look-up table approach is that no change in current standards would be required and that any particular implementation could be left vendor-specific.

A disadvantage of the avoidance approach is that it is complicated by the fact that there are several dimensions to the problem that will all play a role in determining if a particular configuration will give rise to degradation. Parameters the MAC-hs scheduler would need to take into account in addition include:

(1) transport block set size of HS-DSCH transmission;
(2) number of soft information bits to be stored at the WTRU for HARQ; and
(3) number of physical channel bits allocated for the HS-PDSCHs.

For FDD, these parameters are implied by the combination indicator for number of channelization codes and modulation format i ($1 \leq i < 29$), and the transport block size $k_i$, ($0 < k_i < 62$) in TS25.321.

Described below is one embodiment of the present invention that includes a combination of previously described techniques.

The hybrid ARQ functionality matches the number of bits at the output of the channel coder to the total number of bits of the HS-PDSCH set to which the HS-DSCH is mapped. The hybrid ARQ functionality is controlled by the redundancy version (RV) parameters. The exact set of bits at the output of the hybrid ARQ functionality depends on the number of input bits, the number of output bits, and the RV parameters.

The hybrid ARQ functionality consists of two rate-matching stages and a virtual buffer.

The first rate matching stage matches the number of input bits to the virtual IR buffer, information about which is provided by higher layers. Note that, if the number of input bits does not exceed the virtual IR buffering capability, the first rate-matching stage is transparent.

The second rate matching stage matches the number of bits after first rate matching stage to the number of physical channel bits available in the HS-PDSCH set in the TTI.

Definitions of notations used:
$N^{TTI}$: Number of bits in a transmission time interval before rate matching.
$\Delta N_i$: An intermediate calculation variable.
$\Delta N_{i,j}^{TTI}$: If positive—number of bits to be repeated in each transmission time interval on TrCH i with transport format l.
If negative—number of bits to be punctured in each transmission time interval on TrCH i with transport format l.
$\Delta N_{PARITY}$: Number of bits to adjust the length of parity streams by, in HARQ $1^{st}$ stage rate-matching.
$N_{data}$: Total number of bits that are available for the HS-DSCH in a TTI.
$e_{ini}$ Initial value of variable e in the rate matching pattern determination algorithm.
$e_{plus}$ Increment of variable e in the rate matching pattern determination algorithm.
$e_{minus}$ Decrement of variable e in the rate matching pattern determination algorithm.
b: Indicates systematic and parity bits
  b=1: Systematic bit, $x_k$.
  b=2: $1^{st}$ parity bit (from the upper Turbo constituent encoder), $z_k$.
  b=3: $2^{nd}$ parity bit (from the lower Turbo constituent encoder), $z'_k$.

The HARQ bit separation function shall be performed in the same way as bit separation for turbo encoded TrCHs.

HARQ first stage rate matching for the HS-DSCH transport channel shall be performed using the method described below with the following specific parameters.

The maximum number of soft bits available in the virtual IR buffer is $N_{IR}$ which is signaled from higher layers for each HARQ process. The number of coded bits in a TTI before rate matching is $N^{TTI}$ this is deduced from information signaled from higher layers and parameters signaled on the High Speed Synchronization Control Channel (HS-SCCH) for each TTI. Note that HARQ processing and physical layer storage occurs independently for each HARQ process currently active.

If $N_{IR}$ is greater than or equal to $N^{TTI}$ (i.e. all coded bits of the corresponding TTI can be stored) the first rate matching stage shall be transparent. This can, for example, be achieved by setting $e_{minus}=0$. Note that no repetition is performed.

If $N_{IR}$ is smaller than $N^{TTI}$ the parity bit streams are punctured by setting the rate matching parameter $\Delta N_{il}^{TTI} = N_{IR} - N^{TTI}$ where the subscripts i and l refer to transport channel and transport format in the referenced sub-clause. Note the negative value is expected when the rate matching implements puncturing. Bits selected for puncturing which appear as δ shall be discarded and not counted in the totals for the streams through the virtual IR buffer.

If first stage puncturing is to be performed, the procedure below shall be applied. Index b is used to indicate systematic (b=1), $1^{st}$ parity (b=2), and $2^{nd}$ parity bit (b=3). The parameter $\Delta N_{PARITY}$: is the change in length to the parity streams to circumvent problematic puncturing rates.

The first stage rate matching delta is calculated as follows:
if puncturing is to be performed $$X_i = \lfloor N^{TTI}/3 \rfloor;$$

$$PR = \frac{\lfloor -\Delta N_{il}^{TTI}/2 \rfloor}{X_i};$$

$$\Delta N_{PARITY} = 0;$$

$$\delta_{PR} = 49;$$

$$a = 1$$

while ($\alpha \leq 4$)

$$\text{round} = \frac{\lfloor 7 \cdot \alpha \cdot PR + \frac{1}{2} \rfloor}{7 \cdot \alpha}$$

$$\lambda = PR - \text{round}$$

if $\left(|\lambda| > \frac{1}{\delta_{PR}}\right)$ or $\left(PR > \frac{48}{49}\right)$ or $\left(PR < \frac{1}{49}\right)$ then $$\alpha = \alpha + 1$$

$$\delta_{PR} = 98$$

else if ($\lambda > 0$) then $$\Delta N_{PARITY} = \left\| \lfloor -\Delta N_{il}^{TTI}/2 \rfloor - X_i \cdot \left(\text{round} - \frac{1}{\delta_{PR}}\right) \right\|$$

$$\alpha = 5$$

else $$\Delta N_{PARITY} = \left\| \lfloor -\Delta N_{il}^{TTI}/2 \rfloor - X_i \cdot \left(\text{round} + \frac{1}{\delta_{PR}}\right) \right\|$$

$$\alpha = 5$$

end if end while $$\Delta N_i = \begin{cases} \lfloor -\Delta N_{il}^{TTI}/2 \rfloor - \Delta N_{PARITY}, b = 2 \\ \lceil -\Delta N_{il}^{TTI}/2 \rceil + \Delta N_{PARITY}, b = 3 \end{cases}$$

$a = 2$ when $b = 2$ $a = 1$ when $b = 3$

If $\Delta N_i$ is calculated as 0 for b=2 or b=3, then the following procedure and the rate matching algorithm shall not be performed for the corresponding parity bit stream.

For each radio frame, the rate-matching pattern shall be calculated, where:

$X_i$ is as above, $e_{ini} = X_i$ $e_{plus} = a \times X_i$ $e_{minus} = a \times |\Delta N_i|$ HARQ second stage rate matching for the HS-DSCH transport channel shall be done using one of two possible methods.

If second stage puncturing is to be performed, and the Composite Puncturing Rate of one of the parity streams, calculated using the formula below falls in any of the intervals [91/128, 92/128], [217/256, 222/256], [231/256, 232/256], [237/256, 238/256] or [487/512, 488/512], then puncturing of that parity stream shall be performed. Note, puncturing maybe carried out on one, both, or neither of the two parity streams, but never on the systematic parity stream.

Composite Puncturing Ratio, $$CPR = \begin{cases} \frac{\lfloor N^{TTI}/3 \rfloor - N_{t,p1}}{N^{TTI}/3}, b = 2 \\ \frac{\lfloor N^{TTI}/3 \rfloor - N_{t,p2}}{N^{TTI}/3}, b = 3 \end{cases}$$

Otherwise, second stage rate matching for the HS-DSCH transport channel shall be done with the following specific parameters. Bits selected for puncturing which appear as S shall be discarded and are not counted in the streams towards the bit collection.

The parameters of the second rate matching stage depend on the value of the RV parameters s and r. The parameter s can take the value 0 or 1 to distinguish between transmissions that prioritize systematic bits (s=1) and non systematic bits (s=0). The parameter r (range 0 to $r_{max}-1$) changes the initial error variable $e_{ini}$ in the case of puncturing. In case of repetition both parameters r and s change the initial error variable $e_{ini}$. The parameters $X_i$, $e_{plus}$ and $e_{minus}$ are calculated as per table 1 below.

Denote the number of bits before second rate matching as $N_{sys}$ for the systematic bits, $N_{p1}$ for the parity 1 bits, and $N_{p2}$ for the parity 2 bits, respectively. Denote the number of physical channels used for the HS-DSCH by P. $N_{data}$ is the number of bits available to the HS-DSCH in one TTI and defined as $N_{data} = P \times 3 \times N_{data1}$. The rate matching parameters are determined as follows.

For $N_{data} \leq N_{sys} + N_{p1} + N_{p2}$, puncturing is performed in the second rate matching stage. The number of transmitted systematic bits in a transmission is $N_{t,sys} = \min\{N_{sys}, N_{data}\}$ for a transmission that prioritizes systematic bits and $N_{t,sys} = \max\{N_{data} - (N_{p1} + N_{p2}), 0\}$ for a transmission that prioritizes non systematic bits.

For $N_{data} > N_{sys} + N_{p1} + N_{p2}$ repetition is performed in the second rate matching stage. A similar repetition rate in all bit streams is achieved by setting the number of transmitted systematic bits to $$N_{t,sys} = \left\lfloor N_{sys} \cdot \frac{N_{data}}{N_{sys} + 2N_{p1}} \right\rfloor.$$

The number of parity bits in a transmission is:

$$N_{t,p1} = \left( \left\lfloor \frac{N_{data} - N_{t,sys}}{2} \right\rfloor - \Delta N_{PARITY}, 0 \right)$$

and $N_{t,p2} = N_{data} - (N_{t,sys} + N_{t,p1})$ for the parity 1 and parity 2 bits, respectively.

TABLE 1

Parameters for HARQ second rate matching

|  | $X_i$ | $e_{plus}$ | $e_{minus}$ |
|---|---|---|---|
| Systematic RM S | $N_{sys}$ | $N_{sys}$ | $\|N_{sys} - N_{t,sys}\|$ |
| Parity 1 RM P1_2 | $N_{p1}$ | $2 \cdot N_{p1}$ | $2 \cdot \|N_{p1} - N_{t,p1}\|$ |
| Parity 2 RM P2_2 | $N_{p2}$ | $N_{p2}$ | $\|N_{p2} - N_{t,p2}\|$ |

Table 1 above summarizes the resulting parameter choice for the second rate matching stage. The rate matching parameter $e_{ini}$ is calculated for each bit stream according to the RV parameters r and s using $e_{ini}(r) = \{(X_i - \lfloor r \cdot e_{plus}/r_{max} \rfloor - 1) \bmod e_{plus}\} + 1$ in the case of puncturing, i.e., $N_{data} \leq N_{sys} + N_{p1} + N_{p2}$, and $e_{ini}(r) = \{(X_i - \lfloor (s + 2 \cdot r) \cdot e_{plus}/(2 \cdot r_{max}) \rfloor - 1) \bmod e_{plus}\} + 1$ for repetition, i.e., $N_{data} > N_{sys} + N_{p1} + N_{p2}$. Where $r \in \{0, 1, \ldots, r_{max} - 1\}$ and $r_{max}$ is the total number of redundancy versions allowed by varying r. Note that $r_{max}$ varies depending on the modulation mode, i.e. for 16QAM $r_{max} = 2$ and for QPSK $r_{max} = 4$.

Note: For the modulo operation the following clarification is used: the value of (x mod y) is strictly in the range of 0 to y−1 (i.e. −1 mod 10=9).

HARQ second stage rate matching for the HS-DSCH transport channel shall be done with the method described below, which separates each stream into segments with specific parameters calculated below. Bits selected for puncturing which appear as δ shall be discarded and are not counted in the streams towards the bit collection.

The parity stream will be segmented into 3 segments, the first segment will be made up of the first $X_{seg1}$ bits of the parity stream, the second segment will be made up of the next $X_{seg2}$ bits, and the last segment will be made up of the remaining $X_{seg3}$ bits.

The first segment is denoted by $x_{i,1}, x_{i,2}, \ldots, x_{i,Xseg1}$

The second segment by $x_{i,Xseg1+1}, x_{i,Xseg1+2}, \ldots, x_{i,Xseg2}$.

And the final segment by $x_{i,Xseg1+Xseg2+1}, x_{i,Xseg1+Xseg2+2}, \ldots, x_{i,X_i}$ Where $X_{seg1} = 42 \cdot \lfloor X_i/98 \rfloor$, $X_{seg2} = 56 \cdot \lfloor X_i/98 \rfloor$, $X_{seg3} = X_i \bmod 98$ Note: If $X_i$ is less than 98 only the third segment exists, and if $X_i$ is a multiple of 98 then the third segment will be empty. For the case where a particular segment is empty, then of course no puncturing is performed on that non-existent segment.

Additional parameters for HARQ Second Rate Matching Stage for problematic puncturing rates Parameters P, $N_{data}$, $N_{sys}$, $N_{p1}$, $N_{p2}$, $N_{p,t1}$, and $N_{p,t2}$ are calculated, additional parameters are defined below.

Denote the number of parity 1 bits before second rate matching after segmentation as $N_{p1,seg1}$, $N_{p1,seg2}$, $N_{p1,seg3}$ for the parity 1 bits in the $1^{st}$, $2^{nd}$ and $3^{rd}$ segment respectively. Denote the number of parity 2 bits before second rate matching after segmentation as $N_{p2,seg1}$, $N_{p2,seg2}$, $N_{p2,seg3}$ for the parity 1 bits in the $1^{st}$, $2^{nd}$ and $3^{rd}$ segment respectively. The rate matching parameters are determined as follows.

For $N_{data} \leq N_{sys} + N_{p1} + N_{p2}$, puncturing is performed in the second rate matching stage.

The number of parity bits after segmentation is $$N_{pb,seg1} = 42 \cdot \lfloor N_{pb}/98 \rfloor$$

$$N_{pb,seg2} = 56 \cdot \lfloor N_{pb}/98 \rfloor$$

$$N_{pb,seg3} = N_{pb} \bmod 98$$

The number of parity bits in each segment for parity 1 bits (b=2), and parity 2 bits (b=3) is:

$$N_{t,pb,seg1} = \left\lfloor \frac{49 \cdot N_{t,pb} \cdot \lfloor N_{pb}/98 \rfloor}{N_{pb}} + \frac{1}{2} \right\rfloor;$$

$$N_{t,pb,seg2} = \left\lfloor \frac{49 \cdot N_{t,pb} \cdot \lfloor N_{pb}/98 \rfloor}{N_{pb}} + \frac{1}{2} \right\rfloor;$$

$$N_{t,pb,seg3} = N_{t,pb}(N_{t,pb,seg1} + N_{t,pb,seg1})$$

The parameters $X_i$, $e_{plus}$ and $e_{minus}$ are calculated as per table 2 below.

TABLE 2

Parameters for dithered HARQ second rate matching

| Stream | Segment | $X_i$ | $e_{plus}$ | $e_{minus}$ |
|---|---|---|---|---|
| Systematic RM S |  | $N_{sys}$ | $N_{sys}$ | $\|N_{sys} - N_{t,sys}\|$ |
| Parity 1 RM P1_2 | 1st | $N_{p1,seg1}$ | $2 \cdot N_{p1,seg1}$ | $2 \cdot \|N_{p1,seg1} - N_{t,p1,seg1}\|$ |
|  | 2nd | $N_{p1,seg2}$ | $2 \cdot N_{p1,seg2}$ | $2 \cdot \|N_{p1,seg2} - N_{t,p1,seg2}\|$ |
|  | 3rd | $N_{p1,seg3}$ | $2 \cdot N_{p1,seg3}$ | $2 \cdot \|N_{p1,seg3} - N_{t,p1,seg3}\|$ |
| Parity 2 RM P2_2 | 1st | $N_{p2,seg1}$ | $N_{p2,seg1}$ | $\|N_{p2,seg1} - N_{t,p2,seg1}\|$ |
|  | 2nd | $N_{p2,seg2}$ | $N_{p2,seg2}$ | $\|N_{p2,seg2} - N_{t,p2,seg2}\|$ |
|  | 3rd | $N_{p2,seg3}$ | $N_{p2,seg3}$ | $\|N_{p2,seg3} - N_{t,p2,seg3}\|$ |

The rate matching parameter $e_{ini}$ is calculated for each segment of bit stream according to the RV parameters r and s using $e_{ini}(r) = \{(X_i - \lfloor r \cdot e_{plus}/r_{max} \rfloor - 1) \bmod e_{plus}\} + 1$ in the case of puncturing. Where $r \in \{0, 1, \ldots, r_{max} - 1\}$ and $r_{max}$ is the total number of redundancy versions allowed by varying r. Note that $r_{max}$ varies depending on the modulation mode, i.e. for 16QAM $r_{max} = 2$ and for QPSK $r_{max} = 4$.

Note: For the modulo operation the following clarification is used: the value of (x mod y) is strictly in the range of 0 to y−1 (i.e. −1 mod 10=9). The rate matching algorithm is called for each segment of the parity stream in turn.

For both parity streams, after the rate matching algorithm has been called for each of the three segments, the three punctured segments should be concatenated together in their original order.

The re-concatenated bit stream is denoted by:

$$x_{o,seg1,1}, x_{o,seg1,2}, \ldots x_{o,seg1,N_{t,p1,seg1}}, x_{o,seg2,1},$$
$$x_{o,seg2,2}, \ldots x_{o,seg2,N_{t,p1,seg2}}, x_{o,seg3,1}, x_{o,seg3,2}, \ldots$$
$$x_{o,seg3,N_{t,p1,seg3}}$$

The HARQ bit collection is achieved using a rectangular interleaver of size $N_{row} \times N_{col}$. The number of rows and columns are determined from:

$N_{row} = 4$ for 16QAM and $N_{row} = 2$ for QPSK $N_{col} = N_{data}/N_{row}$ where $N_{data}$ is used.

Data is written into the interleaver column by column, and read out of the interleaver column by column starting from the first column.

$N_{t,sys}$ is the number of transmitted systematic bits. Intermediate values $N_r$ and $N_c$ are calculated using:

$$N_r = \left\lfloor \frac{N_{t,sys}}{N_{col}} \right\rfloor \text{ and } N_c = N_{t,sys} - N_r \cdot N_{col}.$$

If $N_c=0$ and $N_r>0$, the systematic bits are written into rows $1 \ldots N_r$.

Otherwise systematic bits are written into rows $1 \ldots N_r+1$ in the first $N_c$ columns and, if $N_r>0$, also into rows $1 \ldots N_r$ in the remaining $N_{col}-N_c$ columns.

The remaining space is filled with parity bits. The parity bits are written column wise into the remaining rows of the respective columns. Parity 1 and 2 bits are written in alternating order, starting with a parity 2 bit in the first available column with the lowest index number. If the two parity streams are of unequal length, Parity 1 and 2 bits shall be written alternately, again starting with a parity 2 bit, until the end of the shorter parity stream, then the remaining parity bits from the longer stream shall be written.

In the case of 16QAM for each column the bits are read out of the interleaver in the order row 1, row 2, row 3, row 4. In the case of QPSK for each column the bits are read out of the interleaver in the order row1, row2.

When the analysis of the rate matching issue was restricted to the situation in which the first stage HS-DSCH rate matching is transparent it was shown that the performance degradation arises from an interaction between the periodicity of the rate matching pattern and the inherent periodicity of the turbo encoder. In particular, it was shown that at the problematic code rates, the positions (in the unpunctured bit stream) of survivor (i.e. non punctured) bits lie in the same position or positions within a modulo 7 period for long segments of the unpunctured stream. It has been demonstrated that performance degradations arise via exactly the same mechanism when the first stage is not transparent.

In the following description, a "puncturing pattern" is defined to be the pattern of positions of bits that are punctured from an original stream. "Puncturing Rate" is defined to be the reciprocal of the number of bits between punctured bit positions (inclusive of the punctured positions) in the original bit stream.

In the case of two-stage rate matching, puncturing that leads to degradation may occur in two ways:
1) A pattern arising from bits punctured in the first stage only
2) A pattern arising from bits punctured after the second stage; this pattern is dependent upon both the first and second rate matching stages.

In order to avoid either of these puncturing mechanisms that cause a performance degradation, the following methodology has been adopted:

In the first stage, test whether the puncturing will cause a problematic puncturing pattern. This is achieved by evaluating an "implicit duration" function, which predicts the length of periodicity in the puncturing pattern. The first stage rate matching is only adjusted if the calculated implicit duration indicates a necessity. In this case, the amount of bits punctured in the first parity stream is increased slightly, whilst in the second stream the number is correspondingly decreased slightly. This has the effect of shifting the puncturing rates in both streams to break up modulo 7 periodicity, whilst keeping the total amount of punctured bits the same. The adjustment in the puncturing rate in each of the streams is kept sufficiently small to leave the coding performance in each stream unaffected.

In the second stage, a composite puncturing rate for each stream, taking into account adjustments to the puncturing rate carried out at the first stage is calculated. The composite puncturing rate in each stream is compared with a look up table, which predicts rates at which modulo-7 periodic patterns, and hence coding degradations, will arise. If the composite rate of a stream falls within a range of problematic rates, a "dithering" algorithm is applied.

Differing puncturing rates are applied in the two parity streams if the puncturing pattern in the first stage will lead to a performance degradation, or is likely to contribute to an unwanted pattern after second stage rate matching. In this case, the number of bits punctured in the first parity stream is reduced by an amount $\Delta N_{PARITY}$, whilst the number of bits punctured in the second stream is increased by the same amount. The decision as to whether such a change should take place is based upon a calculated parameter, which estimates the inverse of the length of runs of survivor bits which hold the same modulo 7 position in the unpunctured stream. This length becomes greater than 49 bits (i.e. 7 modulo 7 periods), then the adjustment to the lengths of the streams is applied.

The dithered puncturing algorithm may be applied to either or both of the two parity streams in the second stage. When processing a parity stream, the algorithm employs two puncturing rates, one higher than the original, and one lower, it then switches between these two puncturing rates whilst applying puncturing to the parity bit stream. The total number of bits punctured is kept the same as it would have been with the original algorithm. Generically it is possible to have one or many switching points between the two puncturing rates within a parity stream. The number of points is not critical to the performance, since the fraction of the bit stream punctured at each rate is independent of the number of switching points.

The number of switching points is set to one (or two), meaning that the punctured stream consists of two (or three) segments in which the first segment uses a lower puncturing rate than the original, the second uses a higher puncturing rate. If the two segments do not account for the whole of the parity stream, a third segment is allowed at the end that is punctured at the original rate. The third segment is kept short, and allows for puncturing exactly the correct amount of bits to maintain the overall puncturing rate. By breaking the parity stream into a low number of segments in this way, the original rate matching algorithm can easily be used with some minor parameter changes.

The difference between the higher puncturing rate in the first segment and the original rate, and also between the lower puncturing rate in the second segment and the original has been set to $1/49$. This selection allows for problematic rates to be avoided in all cases whilst not representing a significant change in coding rate.

In the majority of cases, the modified rate matching algorithm operates in exactly the same manner as previously defined. In the minority of cases in which either the first or second stage rate matching would lead to a performance degradation, unequal length streams and/or dithering are applied. Both of these modifications do not change the body of the rate matching procedure in any way, but rather the rate matching parameters that are applied. Furthermore, in an implementation, the modifications can be achieved with a modification to the Rate Matching DSP software without affecting any other part of the system.

The foregoing is a description of a preferred embodiment and alternative solutions to providing detecting, avoiding/correcting problematic Turbo code puncturing patterns. While this invention has been particularly shown and described with reference to preferred embodiments, it will be understood by those skilled in the art that various changes in form and details may be made therein without departing from the scope of the invention as described hereinabove.

What is claimed is:

1. A method of performing rate matching in a wireless communication terminal, the method comprising:
   interleaving a first bit stream to produce an interleaved first bit stream;
   interleaving a second bit stream to produce an interleaved second bit stream;
   interleaving a third bit stream to produce an interleaved third bit stream;
   buffering the interleaved first bit stream, the interleaved second bit stream and the interleaved third bit stream in a virtual buffer; and
   performing rate matching on at least one output of the virtual buffer.

2. The method of claim 1 wherein the interleaved first bit stream, the interleaved second bit stream and the interleaved third bit stream are buffered on a condition that the number of bits of the interleaved first bit stream, the interleaved second bit stream and the interleaved third bit stream is not larger than a size of the virtual buffer.

3. The method of claim 2, further comprising:
   buffering a portion of the interleaved first bit stream, the interleaved second bit stream and the interleaved third bit stream in the virtual buffer on a condition that the number of bits of the interleaved first bit stream, the interleaved second bit stream and the interleaved third bit stream is larger than a size of the virtual buffer.

4. The method of claim 3 wherein the buffered portion of the interleaved first bit stream, the interleaved second bit stream and the interleaved third bit stream includes all of the interleaved first bit stream.

5. The method of claim 1, further comprising:
   collecting bits associated with the interleaved first bit stream, the interleaved second bit stream and the interleaved third bit stream.

6. The method of claim 1 performed by a wireless transmit/receive unit (WTRU).

7. The method of claim 1 performed by a node B.

8. An apparatus for performing rate matching, the apparatus comprising:
   a first interleaver configured to interleave a first bit stream to produce an interleaved first bit stream;
   a second interleaver configured to interleave a second bit stream to produce an interleaved second bit stream;
   a third interleaver configured to interleave a third bit stream to produce an interleaved third bit stream;
   a virtual buffer configured to buffer the interleaved first bit stream, the interleaved second bit stream and the interleaved third bit stream; and
   a rate matching unit configured to perform rate matching on at least one output of the virtual buffer.

9. The apparatus of claim 8 wherein the interleaved first bit stream, the interleaved second bit stream and the interleaved third bit stream are buffered on a condition that the number of bits of the interleaved first bit stream, the interleaved second bit stream and the interleaved third bit stream is not larger than a size of the virtual buffer.

10. The apparatus of claim 9 wherein the virtual buffer is further configured to buffer a portion of the interleaved first bit stream, the interleaved second bit stream and the interleaved third bit stream on a condition that the number of bits of the interleaved first bit stream, the interleaved second bit stream and the interleaved third bit stream is larger than a size of the virtual buffer.

11. The apparatus of claim 10 wherein the buffered a portion of the interleaved first bit stream, the interleaved second bit stream and the interleaved third bit stream includes all of the interleaved first bit stream.

12. The apparatus of claim 8, further comprising:
   a bit collection unit configured to collect bits associated with the interleaved first bit stream, the interleaved second bit stream and the interleaved third bit stream.

13. The apparatus of claim 7 configured as a wireless transmit/receive unit (WTRU).

14. The apparatus of claim 7 configured as a node B.

* * * * *